United States Patent [19]
Mercado

[11] Patent Number: 5,990,926
[45] Date of Patent: Nov. 23, 1999

[54] PROJECTION LENS SYSTEMS FOR EXCIMER LASER EXPOSURE LITHOGRAPHY

[75] Inventor: Romeo I. Mercado, Fremont, Calif.

[73] Assignee: Nikon Corporation, Tokyo, Japan

[21] Appl. No.: 08/895,898

[22] Filed: Jul. 16, 1997

[51] Int. Cl.[6] ............................... G02B 9/00; G02B 9/60
[52] U.S. Cl. ..................... 347/258; 347/244; 359/662; 359/763; 359/766
[58] Field of Search ..................... 347/244, 258; 359/205, 206, 363, 649, 663, 683, 754, 763, 766, 662

[56] References Cited

U.S. PATENT DOCUMENTS 5,805,344  9/1998  Sasaya et al. ......................... 359/649
5,808,814  9/1998  Kudo ..................................... 359/754

*Primary Examiner*—N. Le
*Assistant Examiner*—Hai C. Pham
*Attorney, Agent, or Firm*—H. Donald Nelson; Debra A. Chun

[57] ABSTRACT

A projection lens system that is used to transfer a pattern from a reticle onto a wafer, incorporates a projection optical system that is capable of maintaining the same, or increased performance, as the current projection lens systems, and that achieves excellent aberration correction, has a numerical aperture of at least 0.6, an exposure field area of at least 18.7×18.7 mm or at least 26.45 mm diameter at the wafer plane, and has a total lens thickness to length ratio less than 0.64 and uses 5 or less aspherical lens surfaces.

56 Claims, 18 Drawing Sheets

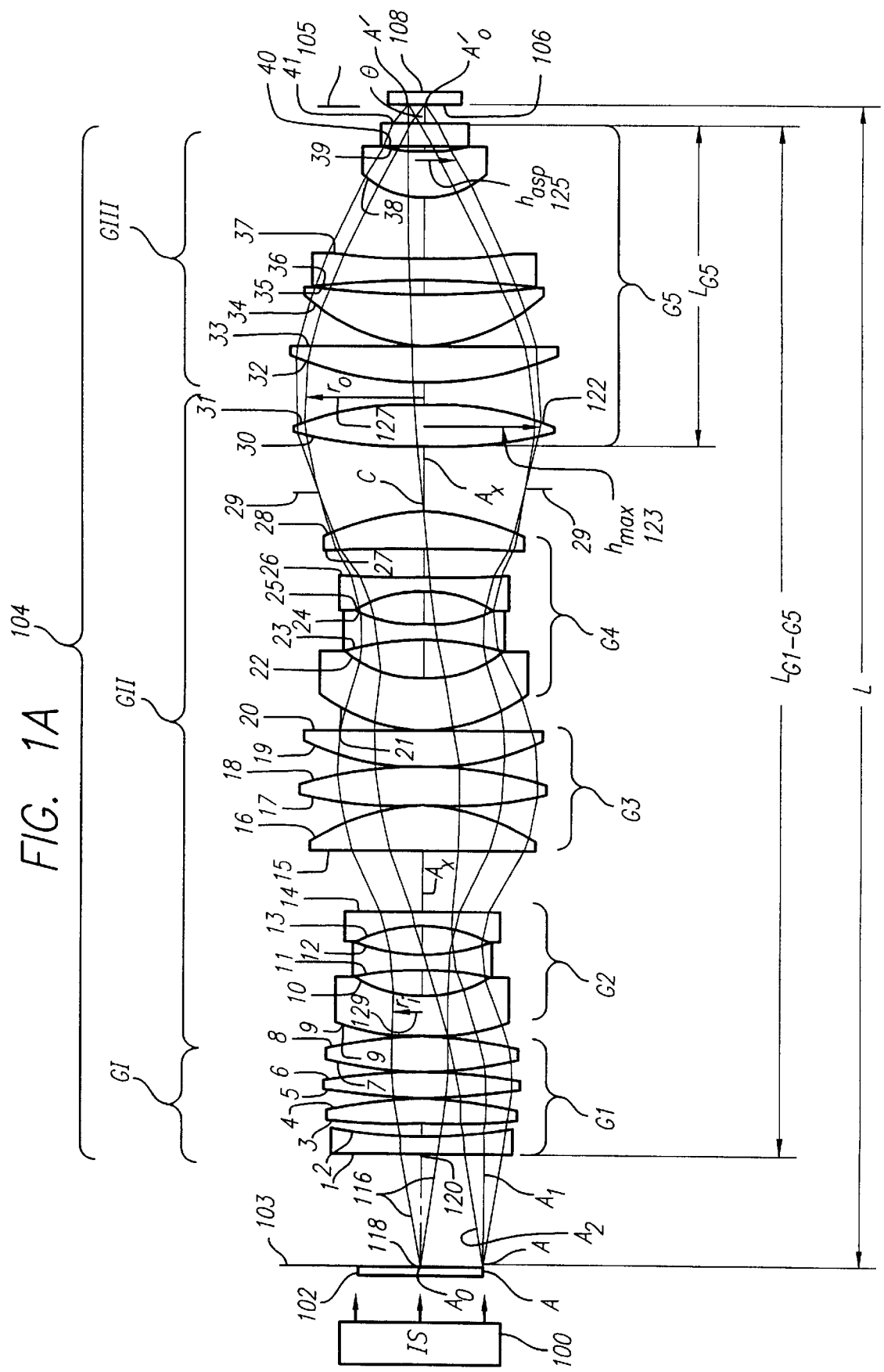

5,990,926

PROJECTION LENS SYSTEMS FOR EXCIMER LASER EXPOSURE LITHOGRAPHY

1. FIELD OF THE INVENTION

This invention relates to projection lens systems for excimer laser exposure lithography in which a pattern formed on a mask or reticle is transferred onto a substrate such as a semiconductor wafer or glass plate. More particularly, the present invention is directed to projection lens systems for excimer laser exposure lithography in which the lens systems have a numerical aperture of at least 0.6 and an exposure field size of at least 18.7×18.7 mm or at least 26.45 mm diameter at the wafer plane. The lens systems achieve excellent aberration correction and have a total lens thickness to reticle-wafer conjugate or object-image conjugate length ratio less than 0.64 and use five or less aspherical lens surfaces.

2. BACKGROUND OF THE INVENTION

In semiconductor device manufacturing, projection optical systems are used to transfer integrated circuit (IC) patterns such as large scale integrated (LSI) circuit patterns from a reticle, also known as a mask, onto a wafer or semiconductor substrate upon which the semiconductor device is to be formed. Because of the difference in the relative sizes of the reticle and the resulting semiconductor device, also known as a die or a semiconductor chip, the projection optical system must be a reduction projection optical system.

Modern integrated circuits are becoming more integrated; that is, more and more functions are being integrated into circuits that are to be included in a single die. At the same time, however, there is a major effort not to allow the die to grow in size in order to maintain or improve the performance and speed of the semiconductor device being manufactured. In order to maintain the same or reduced die size, the reduction projection optical system must have a wider exposure area and a higher resolution.

The drive toward higher density circuitry in microelectronic devices has increased interest in a variety of high resolution lithographic techniques that produce finer resolution patterns at high production rates. The resolution of a lithographic lens system is a function of the exposure wavelength and the numerical aperture of the projection lens system. The resolution or minimum resolvable feature size is directly proportional to wavelength and inversely proportional to the numerical aperture, as follows (a lower value for resolution indicates better resolution):

resolution=$k\lambda$/NA, where k is a proportionality constant, $\lambda$ is the exposure wavelength and NA is the numerical aperture. One method to achieve better resolution of the optical system is to illuminate the reticle with shorter wavelength illumination and/or to use a projection lens system with a higher numerical aperture. In principle, the shorter the wavelength and/or the higher the numerical aperture of the projection lens system, the better the resolution. In the search for shorter wavelength illumination sources, there have been identified several excimer lasers that can be used as illumination sources for semiconductor photolithography, including the KrF excimer laser with a wavelength of 248 nanometers and the ArF excimer laser with a wavelength of 193 nanometers. These excimer lasers replace the traditional illumination sources that have been used for semiconductor manufacturing such as the deuterium lamp or the xenon-mercury arc lamp. The xenon-mercury arc lamp supplies the g-line that has a wavelength of 436 nanometers and the I-line that has a wavelength of 365 nanometers. These two ultraviolet lines have been the mainstay illumination used in semiconductor wafer manufacturing.

One of the advantages of using an excimer laser as an illumination source is that the excimer laser can produce an average power of several watts at a number of wavelengths. The high brightness of the excimer laser light source can either be used to obtain extremely fast exposures or a significantly smaller numerical aperture can be used in the projection lens system and still obtain reasonable exposure times. A smaller numerical aperture results in a larger depth of field that increases quadratically with the inverse of the numerical aperture. One advantage of a larger depth of field permits larger tolerances in wafer distortion and focus that leads to better lithographic patterns.

The excimer gas selected for use in the excimer laser may include only one gas, in which case the output is at the wavelength that is characteristic of the single excimer gas. The choice of which excimer gas to use depends on several factors, such as the characteristics of the photoresist being used in the semiconductor manufacturing process. For example, the KrF excimer gas produces an illumination output at 248 nanometers that is suitable for exposing photoresists such as a novolak resin sensitized with a diazo ketone.

Because an excimer laser has sufficient power at a single wavelength, another major advantage associated with using an excimer laser is that the aberration correction is simplified because the optics can be designed for a single wavelength. Because a single wavelength is used in a particular lens system means, for example, that chromatic aberration problems would be minimized.

As the integrated circuits (ICs) have become more sophisticated, the projection optical systems utilized to transfer the circuit patterns onto the semiconductor wafers or other receptive substrates (e.g. glass plates, etc.) have been required to achieve higher and higher performance levels. These higher performance levels include achieving higher resolution and the maintenance of high levels of aberration correction or the achieving of higher levels of aberration correction at large exposure field areas.

In order to obtain these higher performance levels in the deep ultra violet region of the spectrum, the projection optical lens systems have become very costly since increasing the numerical aperture and exposure field leads to larger diameter lenses and to an increase in volume of the materials required to produce or manufacture the lens elements of the projection lens systems. The high cost of the prior art projection lens systems with typical numerical apertures of 0.5–0.54 is partially attributed to the numerous lens elements and lens sizes necessary to achieve the required diffraction limited performance levels. The high cost has resulted from the fact that the lens elements are made of very expensive materials. In order to project light efficiently in the deep ultra violet region of the electromagnetic spectrum, it has been necessary to use expensive materials such as quartz for the lens elements.

One of the major problems with utilizing the shorter wavelengths provided by the excimer laser illumination is the limited availability of suitable optical materials that can be used in the wavelength range of the excimer laser illumination. The principal reason the conventional optical materials are unsuitable is that the transmission factor of most of the conventional optical materials is too limited to be used at these short wavelengths. Currently, ultraviolet grade fused silica ($SiO_2$), generally referred to as quartz, and ultraviolet grade fluorite ($CaF_2$) with extremely high homogeneity in refractive index are among the few optical materials that are considered feasible for use in short wavelength systems.

Accordingly, there is a need for projection lens systems that use fewer lens elements, small lens diameters and compact or short reticle-to-wafer conjugate distances and that are capable of maintaining or increasing the required high level of performance.

3. SUMMARY OF THE INVENTION

A projection lens system in accordance with the present invention solves the above and other problems associated with conventional projection optical systems by maintaining the same level of performance with fewer lens elements, smaller lens diameters and short conjugate distances as compared to existing optical lens systems.

The above and other objects and advantages of the present invention are attained through a projection lens system in which patterns on a reticle are transferred onto a wafer. A projection lens system according to the present invention includes an illumination optical system to uniformly illuminate the reticle with an illumination of wavelength λ. A reticle stage supports the reticle and a wafer stage supports the wafer. A projection lens system having five groups of lens elements, G1 through G5, is disposed between the reticle and the wafer and projects the pattern on the reticle onto the wafer. The projection lens system has a numerical aperture of at least 0.6 and an exposure field size of at least 18.7×18.7 mm or at least an exposure field with a diameter of 26.45 mm at the wafer plane. In addition, the projection lens system satisfies the following conditions:

$0.50 < T_{G5}/L_{G5} < 0.85$, $0.5 < T_{G1-G5}/L_{G1-G5} < 0.64$, and $0.50 < T_{G1-G5}/L < 0.70$, where $T_{G5}$ is the sum of the axial thickness of each of the lens elements in the fifth group of lens elements G5, $L_{G5}$ is the total axial distance along the optical axis from the first lens surface in the fifth group of lens elements to the last lens surface in the fifth group of lens elements, $T_{G1-G5}$ is the sum of the axial thickness of each of the lens elements in the first group of lens elements G1 through the fifth group of lens elements G5, $L_{G1-G5}$ is the total axial distance along the optical axis from the first lens surface in the first group of lens elements G1 to the last lens surface in the fifth group of lens elements G5, and L is the axial distance along the optical axis from the reticle (object plane) to the wafer (image plane). More desirably, the projection lens system satisfies the condition: $0.59 < T_{G5}/L_{G5} < 0.78$ instead of the condition: $0.50 < T_{G5}/L_{G5} < 0.85$. An aperture stop is disposed between the fourth and fifth group of lens elements. A trace of a light ray originating at an axial point on the reticle will be furthest from the optical axis when in the fifth group of lens elements. The fifth group of lens elements satisfies the condition: $0.21 < h_{asp}/h_{max} \leq 1$, where $h_{max}$ is the maximum distance between the optical axis and the trace of a marginal ray originating on the axial location on the reticle and $h_{asp}$ is the height at which the trace passes through an aspherical lens surface in the fifth group of lens elements. The projection lens system further comprises a first major group of lens elements that includes the first group of lens elements; a second major group of lens elements that includes the lens elements in the second, third and fourth group of lens elements and the first lens element in the fifth group of lens elements; and a third major group of lens elements that includes all of the lens elements in the fifth group of lens elements with the exception of the first lens element in the fifth group of lens elements. The ratio of the height of the marginal ray exiting the second major group of lens elements to the height of the marginal ray entering the second major group of lens elements is $r_o/r_i$ and is $\leq 4.34$. The ratio of the focal length of the third major group to the focal length of the first major group is $f_{III}/f_I$ and satisfies the condition: $0.93 \leq f_{III}/f_I \leq 1.1$.

These and other advantages of the present invention will become more apparent upon a reading of the detailed description of the preferred embodiments that follows, when considered in conjunction with the drawings of which the following is a brief description. It should be clear that the drawings are merely illustrative of the currently preferred embodiments of the present invention, and that the invention is in no way limited to the illustrated embodiments. The present invention is best defined by the claims appended to this specification.

4. BRIEF DESCRIPTION OF THE DRAWINGS

The accompanying drawings incorporated in and forming a part of the specification, illustrate the present invention, and together with the detailed description below serve to explain the principles of the invention. In the drawings:

FIG. 1A is a schematic diagram of the projection lens system according to a first embodiment of the present invention.

5. DESCRIPTION OF THE PREFERRED EMBODIMENTS

Figure 1B:
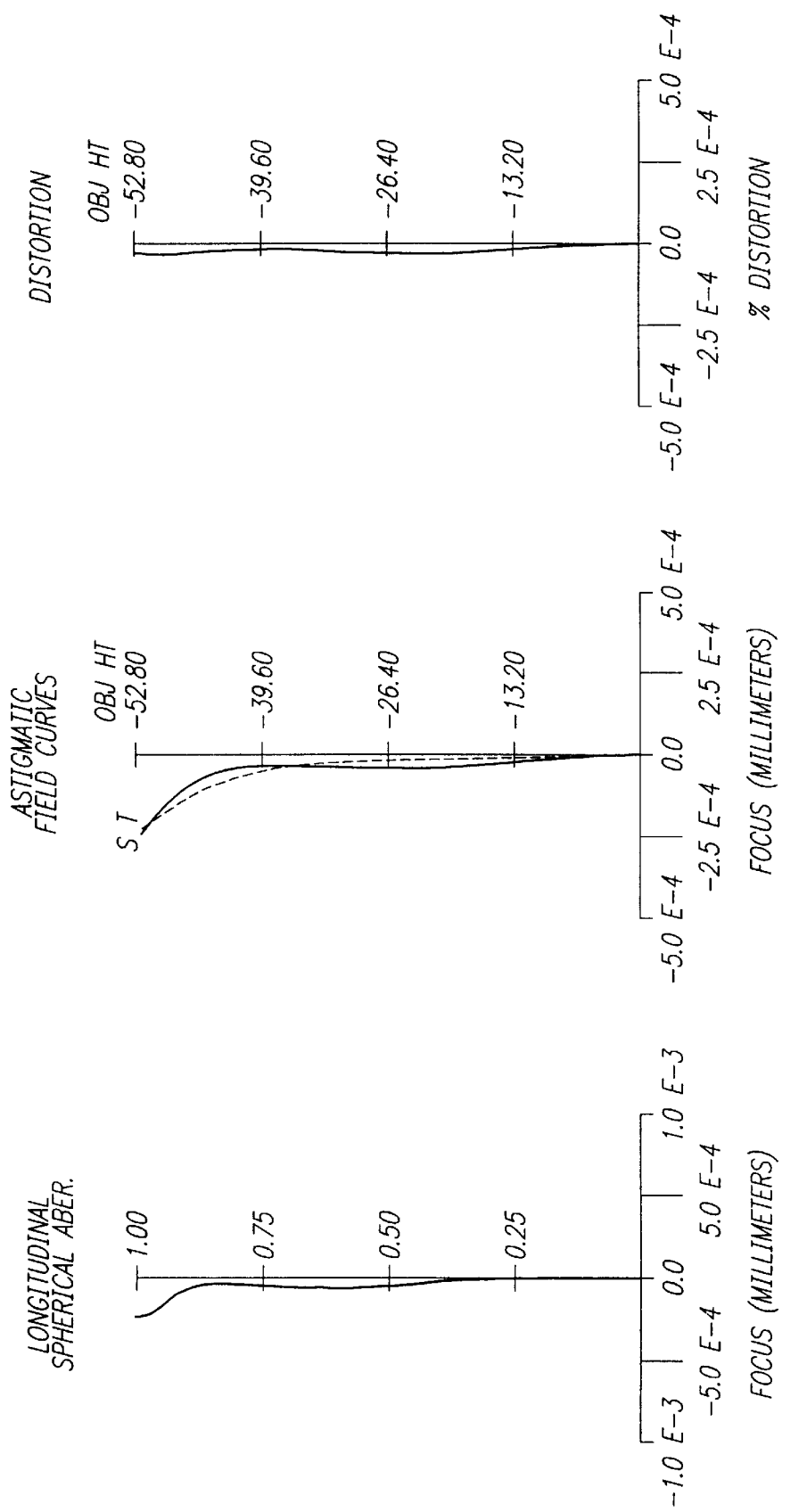
FIG. 1B shows the longitudinal spherical aberration, the astigmatic field curves, and the distortion of the projection lens system shown in FIG. 1A.

The following detailed description is of the presently preferred embodiments of the present invention. It is to be understood that while the detailed description is given utilizing the drawings briefly described above, the invention is not limited to the illustrated embodiments. In the detailed description, like reference numbers refer to like elements.

Referring now to the Figures, the several embodiments of the present invention will now be described. According to standard practice in the optical art, drawings of optical lens systems, such as those shown in the Figures, have the object space, defined as all the space from the first element or surface of a system towards the object and beyond, on the left in the drawing; similarly, the image space, defined as all the space from the last element or surface of a system towards the image and beyond, is on the right in the drawing.

Referring to FIG. 1A, a first embodiment of a projection lens system in accordance with the present invention is shown. In general, a projection lens system such as the projection lens system shown in FIG. 1A includes an illumination system (IS) 100, a reticle 102, located at the object or reticle plane 103, a projection lens system 104, and a wafer 106 located at the image or wafer plane 105 and mounted on a wafer stage 108. As can be appreciated by a person of ordinary skill in the semiconductor manufacturing art, the above components are mounted in a stable secure structure that is not shown in this or any of the succeeding figures. The mounting structure is well known in the semiconductor manufacturing art and will not be discussed.

The illumination system 100 includes a source of illumination, such as a KrF excimer laser emitting illumination at a wavelength $\lambda$ of 248.4 nm (nanometers) or an ArF excimer laser emitting illumination at a wavelength $\lambda$ of 193 nanometers. The following detailed description will be limited to a discussion of an exposure apparatus using a KrF excimer laser emitting illumination at a wavelength of 248.4 nm. Other excimer lasers are known in the art and could be used in place of the KrF excimer laser with minor modifications to the projection lens system. Examples of illumination systems may be found in, for example, U.S. Pat. Nos.: 4,619,508; 4,851,978; 4,939,630; 5,237,367; 5,307,207; and 5,392,094. These patents are incorporated herein by reference in their entirety. An example of an exposure apparatus using an excimer laser source may be found in, for example, U.S. Pat. No. 4,952,945. This patent is incorporated herein by reference in its entirety. A projection exposure apparatus utilizing the output of an excimer laser to transfer the pattern of a reticle onto a semiconductor wafer is known from U.S. Pat. No. 4,458,994. This patent is also incorporated herein by reference in its entirety.

Referring again to FIG. 1A, the projection lens system 104, viewed from the object side, in order of succession, includes a first group of lens elements G1 with an overall positive refractive power, a second group of lens elements G2 with an overall negative refractive power, a third group of lens elements G3 with an overall positive refractive power, a fourth group of lens elements G4 with an overall negative refractive power, and a fifth group of lens elements with an overall positive refractive power. An aperture stop 29 is disposed between the fourth group of lens elements G4 and the fifth group of lens elements G5. It is noted that the term "group of lens elements" includes a group having a single lens element. The fifth group of lens elements G5 has two aspherical lens surfaces, 35 and 39. It is noted that each lens surface in FIG. 1A and subsequent figures is sequentially numbered from the object side to the image side of the lens system.

Referring to FIG. 1A there is shown an off-axis point A on the reticle with traces $A_1$ and $A_2$ representing light rays originating from point A. The ray traces that originate at point A and pass through the pupil defined by the aperture stop 29 contribute to form a point image at the point A' on the wafer surface. The ray of light $A_1$ passing through the center point C on the optical axis AX in the pupil is called a chief ray or principal ray. A chief ray or principal ray is parallel to the optical axis AX in the spaces on the object surface side and the image plane side in the case of a projection optical system in which both sides are telecentric. A ray from an axial object point $A_0$ on the reticle that just passes through the pupil or aperture stop is called a marginal ray. The sine of the angle $\theta$ between the marginal ray and the optical axis at the image plane at $A_0'$ corresponds to the numerical aperture NAw on the wafer side of such a projection optical system and therefore the numerical aperture for the system is expressed as NA=Nsin $\theta$, where N is the refractive index of image space medium that is equal to unity for air. The numerical aperture of such a projection optical system is generally represented as the wafer side value.

The fifth group of lens elements G5 also satisfies the condition: $0.50 < T_{G5}/L_{G5} < 0.85$, where $T_{G5}$ is the sum of the axial thickness of each of the lens elements in the fifth group of lens elements G5 and $L_{G5}$ is the total axial distance along the optical axis from the first lens surface in the fifth group of lens elements to the last lens surface in the fifth group of lens elements. If the above relationship is below the lower limit, it is difficult to adequately correct the optical aberrations at a numerical aperture of 0.6 and with an exposure field size of 18.7×18.7 mm or an exposure field with a diameter of 26.45 mm at the wafer surface. If the above relationship is above the upper limit, the projection lens system is too bulky and expensive since it includes more costly lens elements than necessary. More desirably, the projection lens system satisfies the condition: $0.59 < T_{G5}/L_{G5} < 0.78$ instead of the condition: $0.50 < T_{G5}/L_{G5} < 0.85$. As can be appreciated by one of ordinary skill in the optical projection exposure systems art, there is a tradeoff between the size of the system and optical performance of the system. Generally, the greater the number of lens elements, the easier it is to obtain higher optical performance.

The projection lens system 104 satisfies the condition: $0.50 < T_{G1-G5}/L_{G1-G5} < 0.64$, where $T_{G1-G5}$ is the sum of the axial thickness of each of the lens elements in the first group of lens elements G1 through the fifth group of lens elements G5 and $L_{G1-G5}$ is the total axial distance along the optical axis from the first lens surface in the first group of lens elements G1 to the last lens surface in the fifth group of lens elements G5. If the projection lens system is below the lower limit of the above relationship the optical aberrations are difficult to correct and if the projection lens system is above the upper limit of the above relationship the projection lens system will be very bulky and very expensive.

The projection lens system 104 also satisfies the condition: $0.50 < T_{G1-G5}/L < 0.70$, where $T_{G1-G5}$ is the sum of the axial thickness of each of the lens elements in the first group of lens elements G1 through the fifth group of lens elements G5 and L is the axial distance from the reticle (object plane) to the wafer (image plane).

The projection lens system 104 shown in FIG. 1A has the traces 116 of light rays that originate on an axial point on the reticle, indicated at 118, reaching their furthest points from the optical axis 120 of the projection lens system when the traces are in the fifth group of lens elements G5. The furthest points are indicated at points 122 that are on the lens surface 31.

The projection lens system 104 satisfies the condition: $0.21 < h_{asp}/h_{max} \leq 1$, where $h_{max}$ is the maximum distance between the optical axis 120 and the trace 116 of a marginal ray originating at the axial location 118 on the reticle 102. The maximum distance $h_{max}$ is shown at 123. The value $h_{asp}$ is the distance from the optical axis at which the trace 116 passes through the aspherical lens surface 39 in the fifth group of lens elements. The value hasp is shown at 125. The value of the condition: $0.21 < h_{asp}/h_{max} \leq 1$ determines the most suitable location of an aspherical lens surface in the fifth group of lens elements. If the aspherical lens surface is not located at a location defined by the above condition, the corrections for optical aberrations would be substantially more difficult.

The projection lens system 104 also comprises a first major group of lens elements, $G_I$, that includes the first group of lens elements G1, a second major group of lens elements, $G_{II}$, that includes the second group of lens elements, G2, the third group of lens elements, G3, the fourth group of lens elements, G4, and the first lens element in the fifth group of lens elements, G5, and a third major group of lens elements, $G_{III}$, that includes all the lens elements in the fifth group of lens elements except the first lens element in the fifth group of lens elements.

The ratio of the height of the marginal ray $r_o$, indicated at 127, exiting the second major group of lens elements, $G_{II}$, to the height of the marginal ray $r_i$, indicated at 129, entering the second major group of lens elements, satisfies the condition:

$r_o/r_i \leq 4.34$.

If the ratio $r_o/r_i$ exceeds the limit, the diameter or lens elements in the third major group of lens elements has to be increased to accommodate the larger beam expansion. This would result in added cost and makes compensation for optical aberrations more difficult.

The ratio of the focal length $f_{III}$ of the third major group of lens elements, $G_{III}$, to the focal length $f_I$ of the first major group of lens elements, $G_I$, satisfies the condition:

$0.93 \leq f_{III}/f_I \leq 1.1$.

If the ratio $f_{III}/f_I$ is outside the above upper and lower limits, the axial length of either the first major group or the third major group of lens elements is increased which will, in turn, cause the overall length of the projection lens system to increase.

FIG. 1B shows the longitudinal spherical aberration, the astigmatic field curves, and the distortion of the projection lens system of the first embodiment.

Figure 1C:
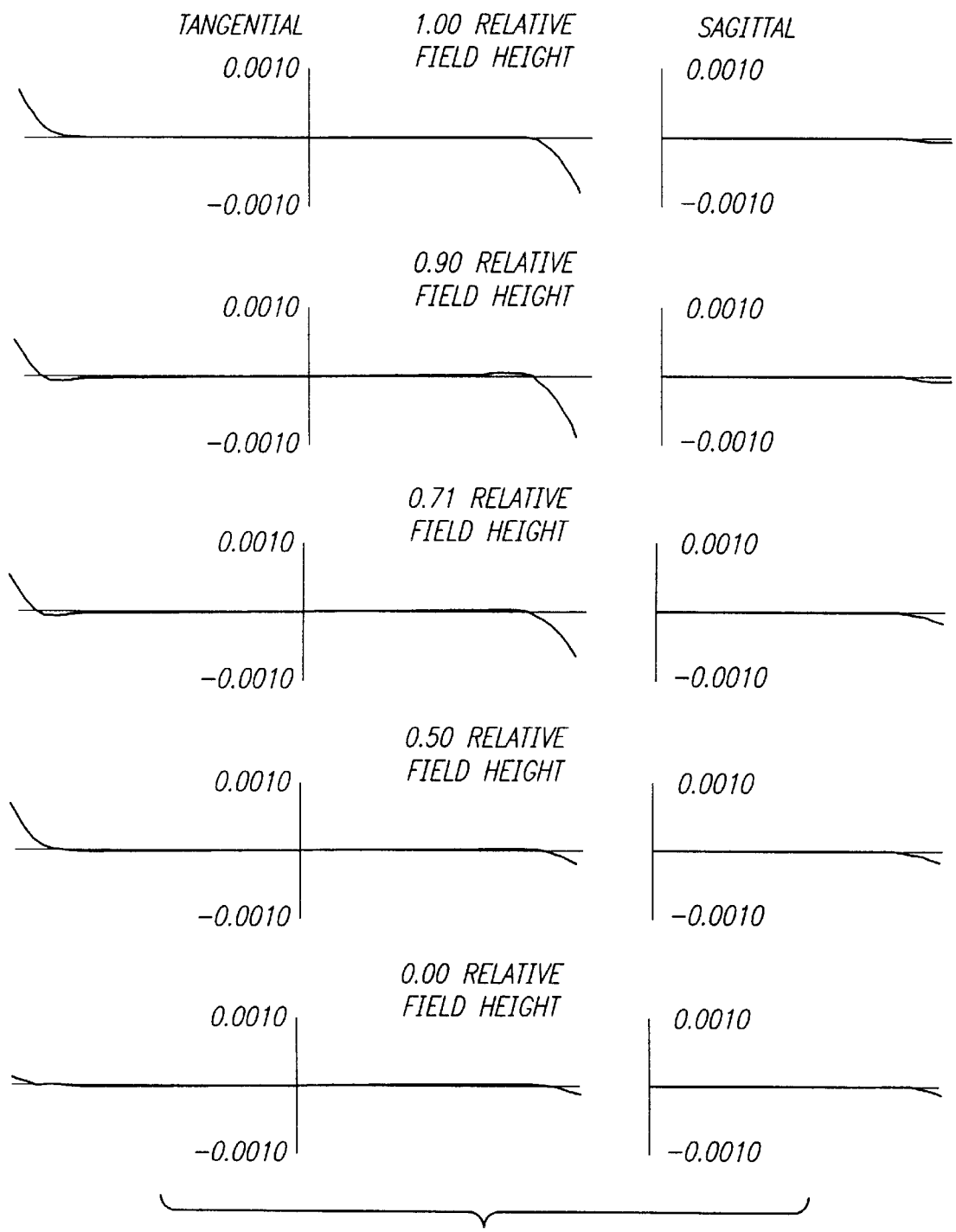
FIG. 1C shows the ray aberrations of the projection lens system shown in FIG. 1A for varying relative field heights all at a wavelength of 248.4 nanometers.

FIG. 1C shows the ray aberrations of the projection lens system of the first embodiment for varying relative field heights at a wavelength of 248.4 nanometers.

Table 1 below shows the values of specifications for the above first embodiment. The numbers in the left end column indicate the order of optical surfaces from the object (reticle) side to the image (wafer) side, r is the curvature radius (millimeters) of the lens surface (a positive radius indicates the center of curvature is towards the right or image side and a negative radius indicates the center of curvature is towards the left or reticle side), d is the axial distance (millimeters) to the next lens surface, and the aspheric constants are the constants in the equation defining the shape of the aspherical surface as follows:

$$z = [(1/R)h^2]/[1+\{1-(1+k)/(1/R)^2 h^2\}^{1/2}] + A_1 h^4 + A_2 h^6 + A_3 h^8 + A_4 h^{10}$$

where z is the sag of the surface parallel to the z-axis and the z-axis is in the optical axis, the $h^2 \times x^2 + y^2$ and the x and y axes are in directions orthogonal to the z axis and optical axis, R is the paraxial radius of curvature, and the aspherical surface coefficients are $A_1, A_2, A_3$, and $A_4$, and k is the conic constant.

The optical material used in all lens elements in Table 1 is fused silica ($SiO_2$). All the lens elements have a refractive index of 1.508379 at a wavelength of 248.4 nm. As can be appreciated by one of ordinary skill in the art, the refractive index can vary slightly depending upon the grade of silica from which the lens element is manufactured and also depends upon the capability of the manufacturer of the lens material.

TABLE 1

Object plane to first optical surface = 100 mm
Last optical surface to image plane = 14.5 mm
$f_{G1}$ = 160.011 mm   $f_{G2}$ = −61.248 mm   $f_{G3}$ = 127.684 mm
$f_{G4}$ = −147.460 mm  $f_{G5}$ = 133.293 mm   F = 726.89 mm
L = 1000 mm             $T_{G5}$ = 187.075 mm   $L_{G5}$ = 277.144 mm
$T_{G1-G5}$ = 537.642 mm  $L_{G1-G5}$ = 885.0 mm  $T_{G1-G5}/L$ = 0.5376
$T_{G5}/L_{G5}$ = 0.675   $T_{G1-G5}/L_{G1-G5}$ = 0.6075  $h_{asp}/h_{max}$ = 0.211
Refractive index of all glass elements = 1.508379 @ a wavelength of 248.4 nm.
NA = 0.60               Exposure field size = 18.7 × 18.7 mm or an exposure field with a diameter of 26.45 mm
$r_i$ = 23.56 mm        $r_o$ = 92.7 mm          $r_i/r_o$ = 3.935
$f_{III}$ = 157.3 mm    $f_I$ = 160.011 mm       $f_{III}/f_I$ = 0.983

| Surface number | Radius of curvature (mm) | axial distance (mm) |
|---|---|---|
| 1 | INFINITY | 12.500000 |
| 2 | 275.72350 | 11.259232 |
| 3 | 884.46683 | 22.057588 |
| 4 | −298.82220 | 0.500000 |
| 5 | 387.03159 | 22.911789 |
| 6 | −525.73388 | 0.500000 |
| 7 | 263.75815 | 29.355164 |
| 8 | −320.49696 | 0.500000 |
| 9 | 192.21338 | 34.362235 |
| 10 | 93.42915 | 22.114026 |
| 11 | −253.40304 | 12.500000 |
| 12 | 114.31808 | 23.743688 |
| 13 | −117.75970 | 12.500000 |
| 14 | 366.01025 | 54.935541 |
| 15 | INFINITY | 37.536384 |
| 16 | −158.67617 | 0.500000 |
| 17 | 429.33088 | 33.933808 |
| 18 | −367.97582 | 0.500000 |
| 19 | 207.00263 | 32.519968 |
| 20 | INFINITY | 0.500000 |
| 21 | 129.90781 | 43.643055 |
| 22 | 91.35068 | 32.846197 |
| 23 | −260.87373 | 12.500000 |
| 24 | 142.2791 | 29.387391 |

TABLE 1-continued

| | | |
|---|---|---|
| 25* | −113.6008 | 12.500000 |
| *Aspherical constants: | | |
| k = −0.453906 | $A_1 = 0.000000$ | $A_2 = 0.521714 \times 10^{-12}$ |
| | $A_3 = 0.128283 \times 10^{-16}$ | $A_4 = -.484200 \times 10^{-21}$ |
| 26 | 530.5990 | 24.515711 |
| 27 | 1935.66547 | 31.747563 |
| 28 | −173.17583 | 16.500000 |
| 29 (AS) | INFINITY | 38.986590 |
| 30 | 421.00067 | 36.649347 |
| 31 | −327.26147 | 18.608238 |
| 32 | 235.06004 | 32.331992 |
| 33 | INFINITY | 0.587552 |
| 34 | 132.55016 | 43.010191 |
| 35* | 619.58547 | 11.961767 |
| *Aspherical constants: | | |
| k = 14.248763 | $A_1 = 0.000000$ | $A_2 = -.168187 \times 10^{-11}$ |
| | $A_3 = 0.158318 \times 10^{-16}$ | $A_4 = -.829740 \times 10^{-21}$ |
| 36 | −835.98582 | 18.268121 |
| 37 | 490.79983 | 54.097869 |
| 38 | 69.29137 | 38.064994 |
| 39* | 143.88553 | 4.814053 |
| *Aspherical constants: | | |
| k = 5.450839 | $A_1 = 0.000000$ | $A_2 = -.281775 \times 10^{-10}$ |
| | $A_3 = -.120797 \times 10^{-13}$ | $A_4 = -.257094 \times 10^{-17}$ |
| 40 | −2878.82771 | 18.750127 |
| 41 | INFINITY | 15.000000 |
| IMG | INFINITY | 0.000000 |

Where $f_{G1}$ is the focal length of the first group of lens elements G1, $f_{G2}$ is the focal length of the second group of lens elements G2, $f_{G3}$ is the focal length of the third group of lens elements G3, $f_{G4}$ is the focal length of the fourth group of lens elements G4, and $f_{G5}$ is the focal length of the fifth group of lens elements G5. F is the overall focal length of the projection lens system and L is the overall length of the projection lens system (from the reticle plane to the wafer plane). $T_{G1-G5}$ is the sum of the axial lens element thicknesses along the optical axis in the first through the fifth group of lens elements. $T_{G5}$ is the sum of the axial lens element thicknesses along the optical axis in the fifth group of lens elements. $L_{G1-G5}$ is the total axial length along the optical axis from the first lens surface in the first group of lens elements to the last lens surface in the fifth group of lens elements. $L_{G5}$ is the total axial length along the optical axis from the first lens surface in the fifth group of lens elements to the last lens surface in the fifth group of lens elements. $f_I$ is the focal length of the first major group of lens elements and $f_{III}$ is the focal length of the third major group of lens element. $r_i$ is the height of a marginal ray entering the second major group of lens elements and $r_o$ is the height of the marginal ray exiting the second major group of lens elements.

Figure 2A:
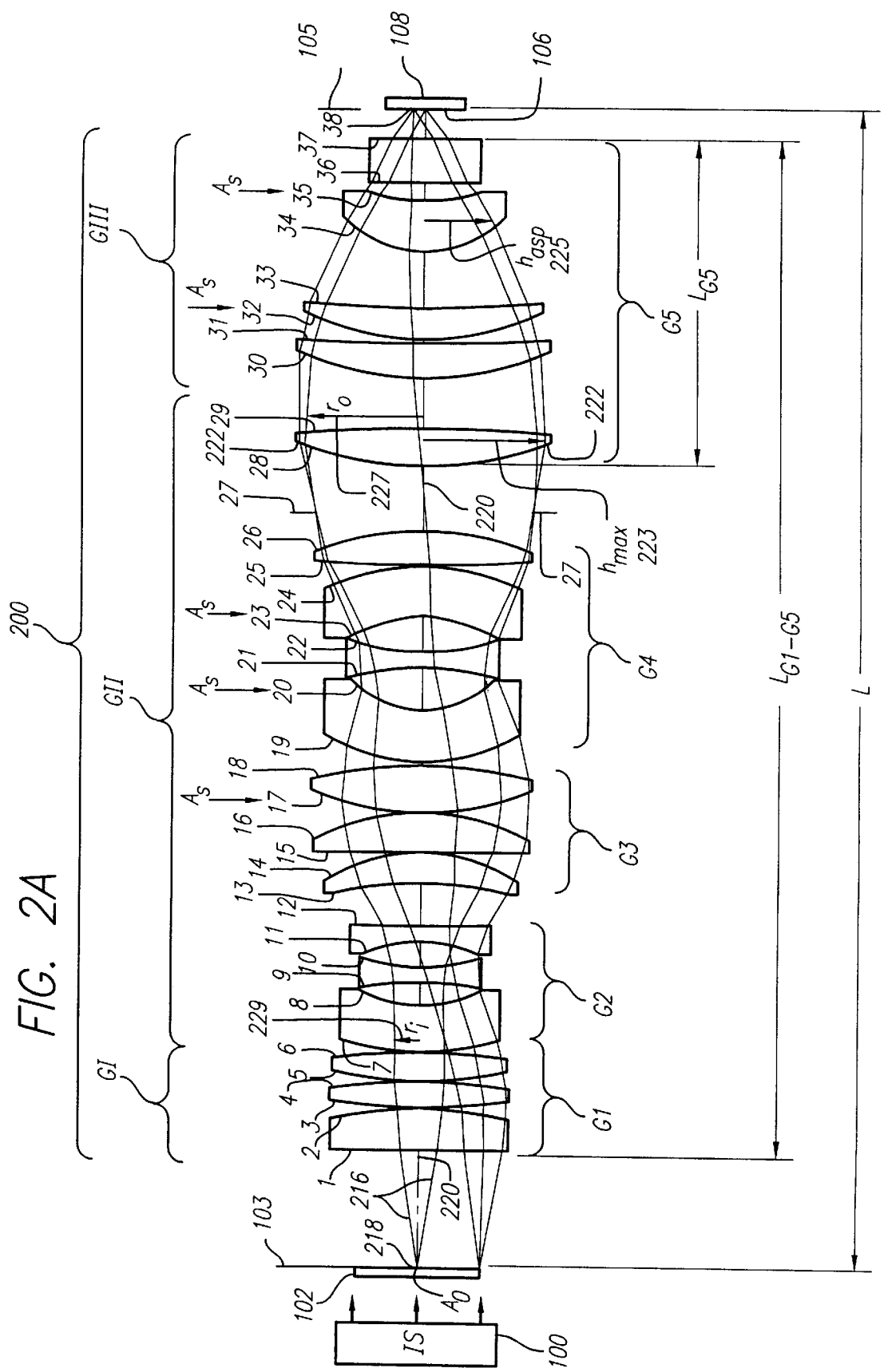
FIG. 2A is a schematic diagram of the projection lens system according to a second embodiment of the present invention.

Referring to FIG. 2A, there is shown a second embodiment of a projection lens system in accordance with the present invention. The projection lens system 200, viewed from the object side, in order of succession, includes a first group of lens elements G1 with an overall positive refractive power, a second group of lens elements G2 with an overall negative refractive power, a third group of lens elements G3 with an overall positive refractive power, a fourth group of lens elements G4 with an overall negative refractive power, and a fifth group of lens elements with an overall positive refractive power. An aperture stop 27 is disposed between the fourth group of lens elements G4 and the fifth group of lens elements G5. The fifth group of lens elements G5 has two aspherical lens surfaces, 32 and 35.

The fifth group of lens elements G5 also satisfies the condition: $0.50 < T_{G5}/L_{G5} < 0.85$, where $T_{G5}$ is the sum of the axial thickness each of the lens elements in the fifth group of lens elements G5 and where $L_{G5}$ is the axial distance along the optical axis from the first lens surface in the fifth group of lens elements to the last lens surface in the fifth group of lens elements. If the above relationship is below the lower limit, it is difficult to adequately correct the optical aberrations at a numerical aperture of 0.6 and with an exposure field size of 18.7×18.7 mm or an exposure field with a diameter of 26.45 mm at the wafer plane. If the above relationship is above the upper limit, the projection lens system is too bulky and expensive since it includes more costly lens elements than necessary. More desirably, the projection lens system satisfies the condition: $0.59 < T_{G5}/L_{G5} < 0.78$ instead of the condition: $0.50 < T_{G5}/L_{G5} < 0.85$. As can be appreciated by one of ordinary skill in the projection exposure optical systems art, there is a tradeoff between the number of lens elements in the optical system and the optical performance of the optical system. Generally, the greater the number of expensive lens elements, the easier it is to obtain higher optical performance.

The projection lens system 200 satisfies the condition: $0.50 < T_{G1-G5}/L_{G1-G5} < 0.64$, where $T_{G1-G5}$ is the sum of the axial thicknesses along the optical axis of each of the lens elements in the first group of lens elements G1 through the fifth group of lens elements G5 and $L_{G1-G5}$ is the total axial distance along the optical axis from the first lens surface in the first group of lens elements G1 to the last lens surface in the fifth group of lens elements G5. If the above projection lens system is below the lower limit of the above relationship the optical aberrations are very difficult to correct and if the projection lens system is above the upper limit of the above relationship the apparatus will be too bulky and expensive.

The projection lens system 200 also satisfies the condition: $0.50 < T_{G1-G5}/L < 0.70$, where $T_{G1-G5}$ is the sum of the axial thickness of each of the lens elements in the first group of lens elements G1 through the fifth group of lens elements G5 and L is the axial distance from the reticle (object plane) to the wafer (image plane).

The projection lens system 200 shown in FIG. 2A has the traces 216 of light rays that originate on an axial point on the reticle, indicated at 218, reaching their furthest points from the optical axis 220 of the projection lens system when the traces are in the fifth group of lens elements G5. The furthest points are indicated at points 222 that are on lens surface 28.

The projection lens system 200 satisfies the condition: $0.21 < h_{asp}/h_{max} \leq 1$, where $h_{max}$ is the maximum distance between the optical axis 220 and the trace 216 of a marginal ray originating on the axial location 218 on the reticle 102. The maximum distance $h_{max}$ is shown at 223. The value $h_{asp}$ is the distance from the optical axis at which the trace 216 passes through the aspherical lens surface 35 in the fifth group of lens elements. The value $h_{asp}$ is shown at 225. The value of the condition: $0.21 < h_{asp}/h_{max} \leq 1$ determines the most suitable location of an aspherical lens surface in the fifth group of lens elements. If the aspherical lens surface is not located at a location defined by the above condition, the corrections for optical aberrations would be substantially more difficult.

The projection lens system 200 also comprises a first major group of lens elements, $G_I$, that includes the first group of lens elements G1, a second major group of lens elements, $G_{II}$, that includes the second group of lens elements, G2, the third group of lens elements, G3, the fourth group of lens elements, G4, and the first lens element in the fifth group of lens elements, G5, and a third major group of lens elements, $G_{III}$, that includes all the lens elements in the fifth group of lens elements except the first lens element in the fifth group of lens elements.

The ratio of the height of the marginal ray $r_o$, indicated at 227, exiting the second major group of lens elements, $G_{II}$, to the height of the marginal ray $r_i$, indicated at 229, entering the second major group of lens elements, satisfies the condition:

$r_o/r_i \leq 4.34$.

If the ratio $r_o/r_i$ exceeds the limit, the diameter or lens elements in the third major group of lens elements has to be increased to accommodate the larger beam expansion. This would result in added cost and makes compensation for optical aberrations more difficult.

The ratio of the focal length $f_{III}$ of the third major group of lens elements, $G_{III}$, to the focal length $f_I$ of the first major group of lens elements, $G_I$, satisfies the condition:

$0.93 \leq f_{III}/f_I \leq 1.1$.

If the ratio $f_{III}/f_I$ is outside the above upper and lower limits, the axial length of either the first major group or the third major group of lens elements is increased which will, in turn, cause the overall length of the projection lens system to increase.

Figure 2B:
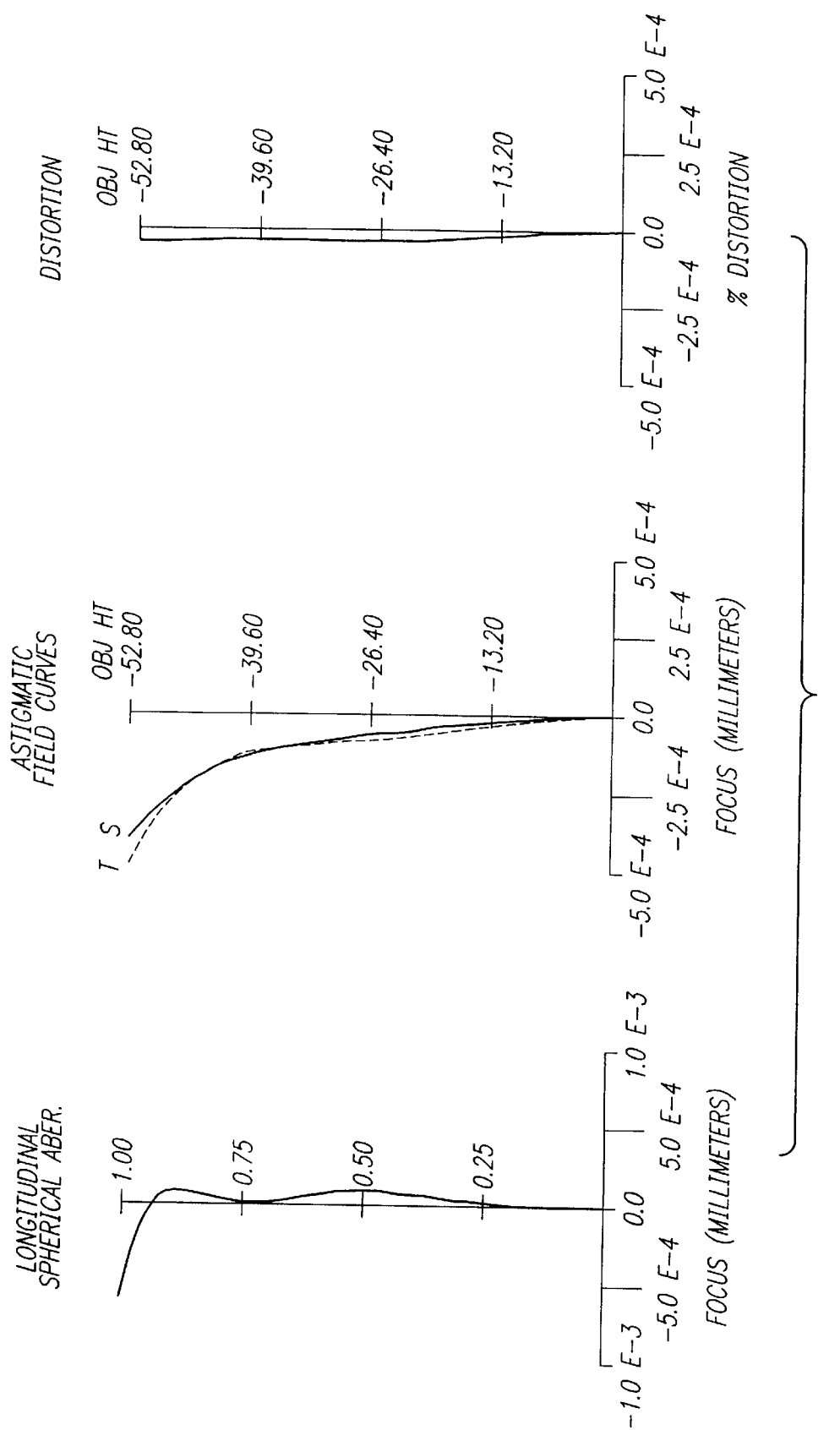
FIG. 2B shows the longitudinal spherical aberration, the astigmatic field curves, and the distortion of the projection lens system shown in FIG. 2A.

FIG. 2B shows the longitudinal spherical aberration, the astigmatic field curves, and the distortion of the projection lens system of the first embodiment.

Figure 2C:
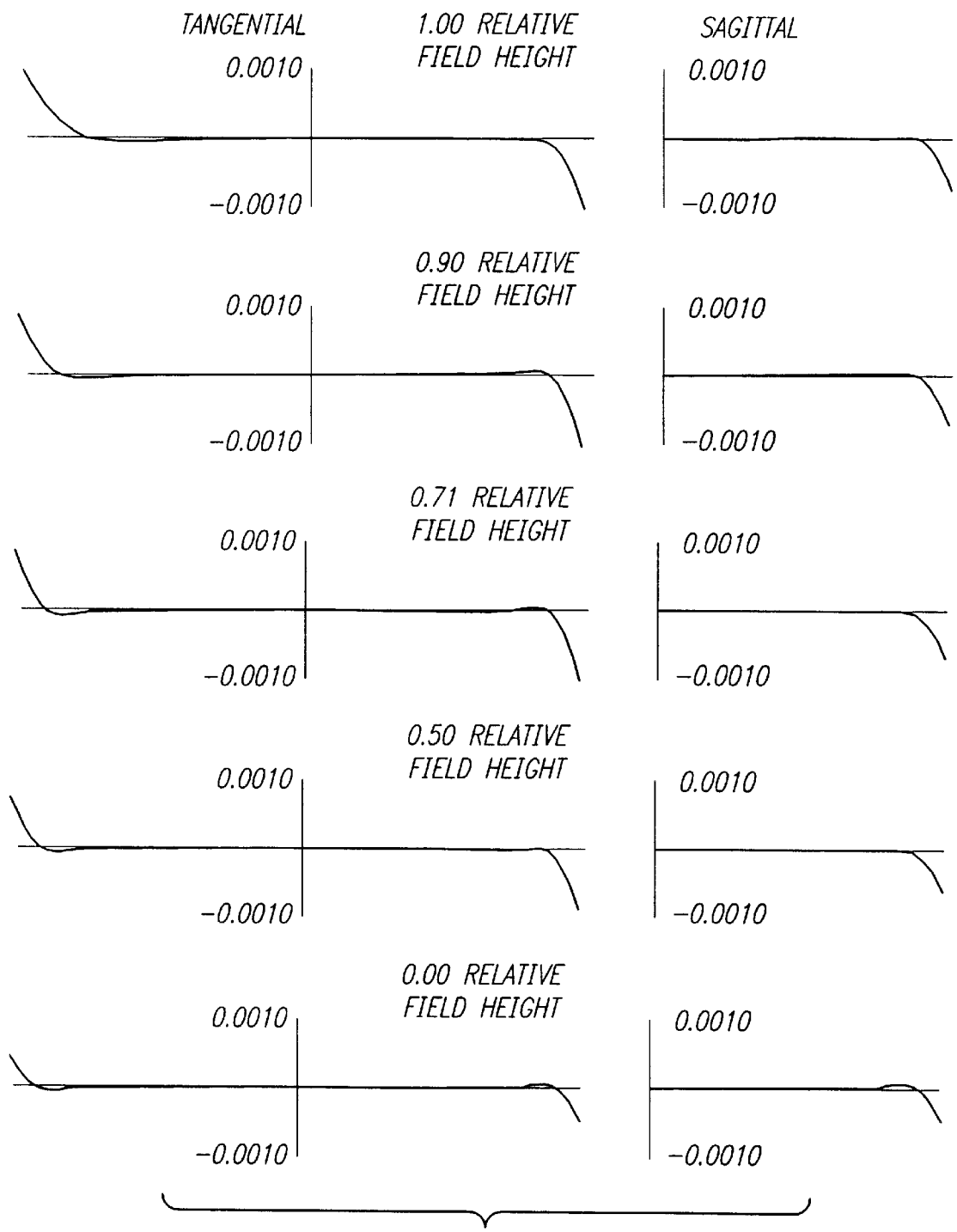
FIG. 2C shows the ray aberrations of the projection lens system shown in FIG. 2A for varying relative field heights all at a wavelength of 248.4 nanometers.

FIG. 2C shows the ray aberrations of the projection lens system of the first embodiment for varying relative field heights at a wavelength of 248.4 nanometers.

Table 2 below shows the values of specifications for the above second embodiment. The parameters are the same as described above for Table 1.

The optical material used in all lens elements in Table 2 is fused silica ($SiO_2$). All the lens elements have a refractive index of 1.508379 at a wavelength of 248.4 nm. As can be appreciated by one of ordinary skill in the art, the refractive index can vary slightly depending upon the grade of silica from which the lens elements is manufactured and also depends upon the capability of the manufacturer of the lens element.

TABLE 2

Object plane to first optical surface = 100.000 mm
Last optical surface to image plane = 14.5 mm
$f_{G1}$ = 155.705 mm   $f_{G2}$ = −54.633 mm   $f_{G3}$ = 113.190 mm
$f_{G4}$ = −196.250 mm   $f_{G5}$ = 138.806 mm   F = 835.698 mm
L = 978 mm   $T_{G5}$ = 168.016 mm   $L_{G5}$ = 277.007 mm
$T_{G1-G5}$ = 536.836 mm   $L_{G1-G5}$ = 856.465 mm   $T_{G1-G5}/L$ = 0.5489
$T_{G5}/L_{G5}$ = 0.60654   $T_{G1-G5}/L_{G1-G5}$ = 0.6268   $h_{asp}/h_{max}$ = 0.403
Refractive index of all glass elements = 1.508379 @ a wavelength of 248.4 nm.
NA = 0.60   Exposure field size = 18.7 × 18.7 mm or an exposure field with a diameter of 26.45 mm
$r_i$ = 20.763 mm   $r_o$ = 89.6 mm   $r_i/r_o$ = 4.315
$f_{III}$ = 152.875 mm   $f_I$ = 155.705 mm   $f_{III}/f_I$ = 0.982

| Surface number | Radius of curvature (mm) | axial distance (mm) |
|---|---|---|
| 1 | INFINITY | 33.948263 |
| 2 | −334.35529 | 1.078791 |
| 3 | 371.01033 | 21.177078 |
| 4 | −590.19655 | 0.500000 |
| 5 | 249.20108 | 23.691747 |
| 6 | −580.93892 | 0.500000 |
| 7 | 212.90881 | 38.012588 |
| 8 | 90.63568 | 19.820913 |
| 9 | −223/85301 | 12.500000 |
| 10 | 103.70537 | 23.260400 |
| 11 | −101.61325 | 12.500000 |
| 12 | 432.01891 | 38.781754 |
| 13 | −362.46092 | 26.770591 |
| 14 | −133.94643 | 0.519919 |
| 15 | INFINITY | 32.479806 |

TABLE 2-continued

| | | |
|---|---|---|
| 16 | −178.44584 | 0.500000 |
| 17* | 191.54849 | 38.998626 |
| *Aspherical constants: | | |
| k = −3.385884 | $A_1$ = 0.000000 | $A_2$ = −.166654 × $10^{-11}$ |
| | $A_3$ = 0.148325 × $10^{-15}$ | $A_4$ = −.348675 × $10^{-20}$ |
| 18 | −382.82415 | 3.093245 |
| 19 | 150.30578 | 42.539416 |
| 20* | 73.36600 | 36.991882 |
| *Aspherical constants: | | |
| k = −0.520717 | $A_1$ = 0.000000 | $A_2$ = −.710503 × $10^{-11}$ |
| | $A_3$ = −.560191 × $10^{-15}$ | $A_4$ = 0.324131 × $10^{-19}$ |
| 21 | −200.42610 | 12.500000 |
| 22 | 173.80717 | 30.169201 |
| 23* | −106.68301 | 45.000000 |
| *Aspherical constants: | | |
| k = −.617002 | $A_1$ = 0.000000 | $A_2$ = −.137383 × $10^{-11}$ |
| | $A_3$ = −.541984 × $10^{-16}$ | $A_4$ = −.420549 × $10^{-20}$ |
| 24 | −178.61121 | 0.758889 |
| 25 | 1082.82136 | 28.701498 |
| 26 | −253.21379 | 15.000000 |
| 27 (AS) | INFINITY | 39.663403 |
| 28 | 283.43403 | 30.880092 |
| 29 | −1831.68207 | 43.802890 |
| 30 | 221.87446 | 29.452265 |
| 31 | 1111.11119 | 3.794810 |
| 32* | 199.98231 | 27.115077 |
| *Aspherical constants: | | |
| k = −1.523628 | $A_1$ = 0.000000 | $A_2$ = 0.284310 × $10^{-12}$ |
| | $A_3$ = −.155055 × $10^{-16}$ | $A_3$ = −.406815 × $10^{-21}$ |
| 33 | 933.09671 | 47.435350 |
| 34 | 91.69502 | 43.957072 |
| 35* | 220.21678 | 13.957390 |
| *Aspherical constants: | | |
| k = 5.379822 | $A_1$ = 0.000000 | $A_2$ = −.528964 × $10^{-11}$ |
| | $A_3$ = −.488130 × $10^{-15}$ | $A_4$ = −.106529 × $10^{-18}$ |
| 36 | INFINITY | 36.611774 |
| 37 | INFINITY | 21.535202 |
| IMG | INFINITY | 0.000000 |

Where all of the parameter definitions are the same as described above for Table 1.

Figure 3A:
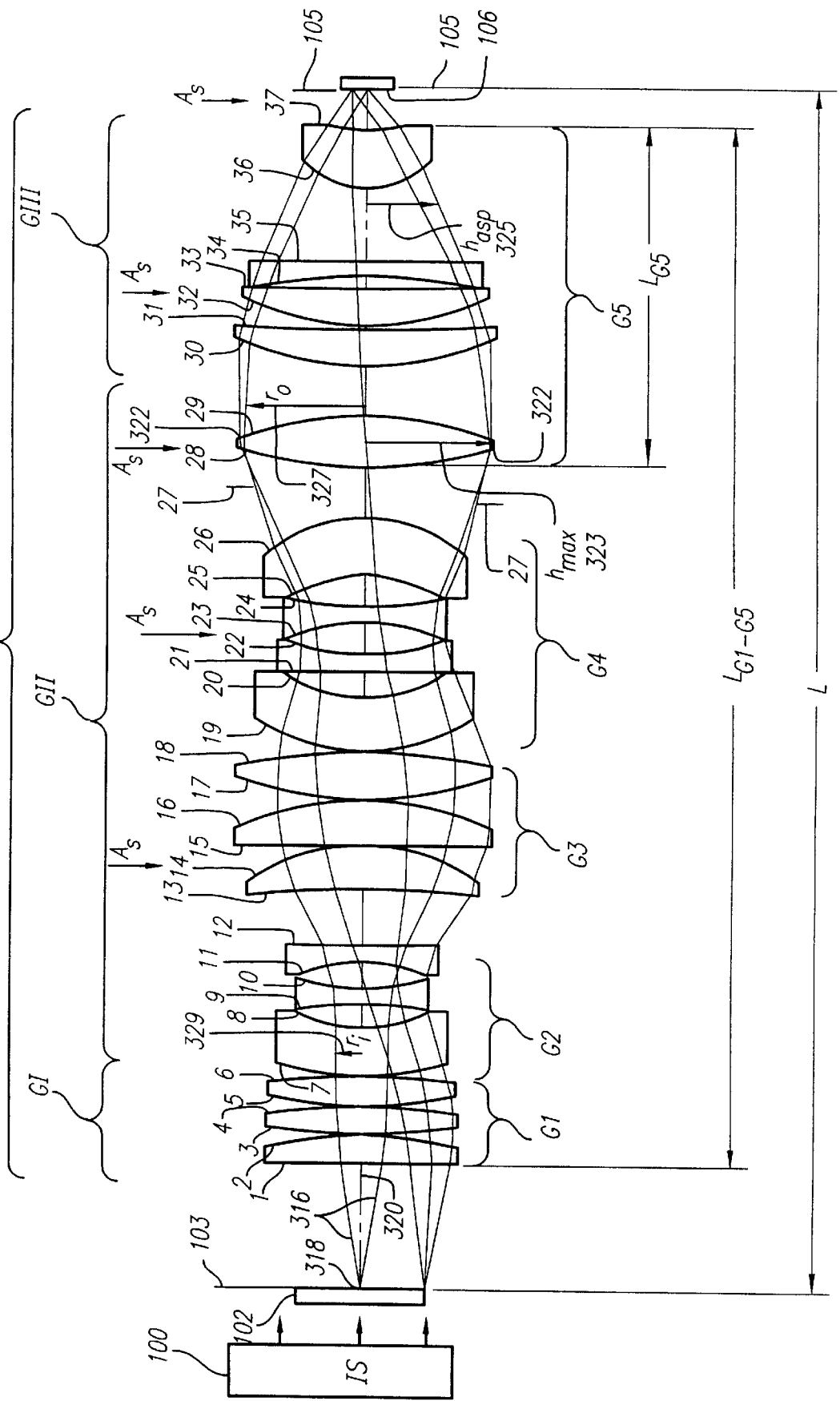
FIG. 3A is a schematic diagram of the projection lens system according to a third embodiment of the present invention.

Referring to FIG. 3A, a third embodiment of a projection lens system in accordance with the present invention is shown. The projection lens system 300, viewed from the object side, in order of succession, includes a first group of lens elements G1 with an overall positive refractive power, a second group of lens elements G2 with an overall negative refractive power, a third group of lens elements G3 with an overall positive refractive power, a fourth group of lens elements G4 with an overall negative refractive power, and a fifth group of lens elements with an overall positive refractive power. An aperture stop 27 is disposed between the fourth group of lens elements G4 and the fifth group of lens elements G5. The fifth group of lens elements G5 has three aspherical lens surfaces, 28, 32 and 37.

The fifth group of lens elements G5 also satisfies the condition: $0.50 < T_{G5}/L_{G5} < 0.85$, where $T_{G5}$ is the sum of the axial thickness axis of each of the lens elements in the fifth group of lens elements G5 and $L_{G5}$ is the axial distance along the optical axis from the first lens surface in the fifth group of lens elements to the last lens surface in the fifth group of lens elements. If the above relationship is below the lower limit, it is difficult to adequately correct the optical aberrations at a numerical aperture of 0.6 and with an exposure field size of 18.7×18.7 mm or an exposure field with a diameter of 26.45 mm at the wafer plane. If the above relationship is above the upper limit, the projection lens system is too bulky and expensive since it includes more lens elements than necessary. More desirably, the projection lens system satisfies the condition: $0.59 < T_{G5}/L_{G5} < 0.78$ instead of the condition: $0.50 < T_{G5}/L_{G5} < 0.85$. As can be appreciated by one of skill in the projection exposure optical system art, there is a tradeoff between size of the system and optical performance. Generally, the greater the number of expensive lens elements, the easier it is to obtain higher optical performance.

The projection lens system 300 satisfies the condition: $0.50 < T_{G1-G5}/L_{G1-G5} < 0.64$, where $T_{G1-G5}$ is the sum of the axial thickness of each of the lens elements in the first group of lens elements G1 through the fifth group of lens elements G5 and $L_{G1-G5}$ is the total axial distance along the optical axis from the first lens surface in the first group of lens elements G1 to the last lens surface in the fifth group of lens elements G5. If the projection lens system is below the lower limit of the above relationship the optical aberrations are very difficult to correct and if the projection lens system is above the upper limit of the above relationship the apparatus will be too bulky and expensive.

The projection lens system 300 also satisfies the condition: $0.50 < T_{G1-G5}/L < 0.70$, where $T_{G1-G5}$ is the sum of the axial thickness of each of the lens elements in the first group of lens elements G1 through the fifth group of lens elements G5 and L is the axial distance from the reticle (object plane) to the wafer (image plane).

The projection lens system 300 shown in FIG. 3A has the traces 316 of light rays that originate on an axial point on the reticle, indicated at 318, reaching their furthest points from the optical axis 320 of the projection lens system when the traces are in the fifth group of lens elements G5. The furthest points are indicated at points 322 that are on lens surface 29.

The projection lens system 300 satisfies the condition: $0.21 < h_{asp}/h_{max} \leq 1$, where $h_{max}$ is the maximum distance between the optical axis 320 and the trace 316 of a marginal ray originating on the axial location 318 on the reticle 102. The maximum distance $h_{max}$ is shown at 323. The value $h_{asp}$ is the distance from the optical axis at which the trace 316 passes through the aspherical lens surface 37 in the fifth group of lens elements. The value $h_{asp}$ is shown at 325. The value of the condition: $0.21 < h_{asp}/h_{max} \leq 1$ determines the most suitable location of an aspherical lens surface in the fifth group of lens elements. If the aspherical lens surface is not located at a location defined by the above condition, the corrections for optical aberrations would be substantially more difficult.

The projection lens system 300 also comprises a first major group of lens elements, $G_I$, that includes the first group of lens elements G1, a second major group of lens elements, $G_{II}$, that includes the second group of lens elements, G2, the third group of lens elements, G3, the fourth group of lens elements, G4, and the first lens element in the fifth group of lens elements, G5, and a third major group of lens elements, $G_{III}$, that includes all the lens elements in the fifth group of lens elements except the first lens element in the fifth group of lens elements.

The ratio of the height of the marginal ray $r_o$, indicated at 327, exiting the second major group of lens elements, $G_{II}$, to the height of the marginal ray $r_i$, indicated at 329, entering the second major group of lens elements, satisfies the condition:

$r_o/r_i < 4.34$.

If the ratio $r_o/r_i$ exceeds the limit, the diameter or lens elements in the third major group of lens elements has to be increased to accommodate the larger beam expansion. This would result in added cost and makes compensation for optical aberrations more difficult.

The ratio of the focal length $f_{III}$ of the third major group of lens elements, $G_{III}$, to the focal length $f_I$ of the first major group of lens elements, $G_I$, satisfies the condition:

$0.93 \leq f_{III}/f_I \leq 1.1$.

If the ratio $f_{III}/f_I$ is outside the above upper and lower limits, the axial length of either the first major group or the third major group of lens elements is increased which will, in turn, cause the overall length of the projection lens system to increase.

Figure 3B:
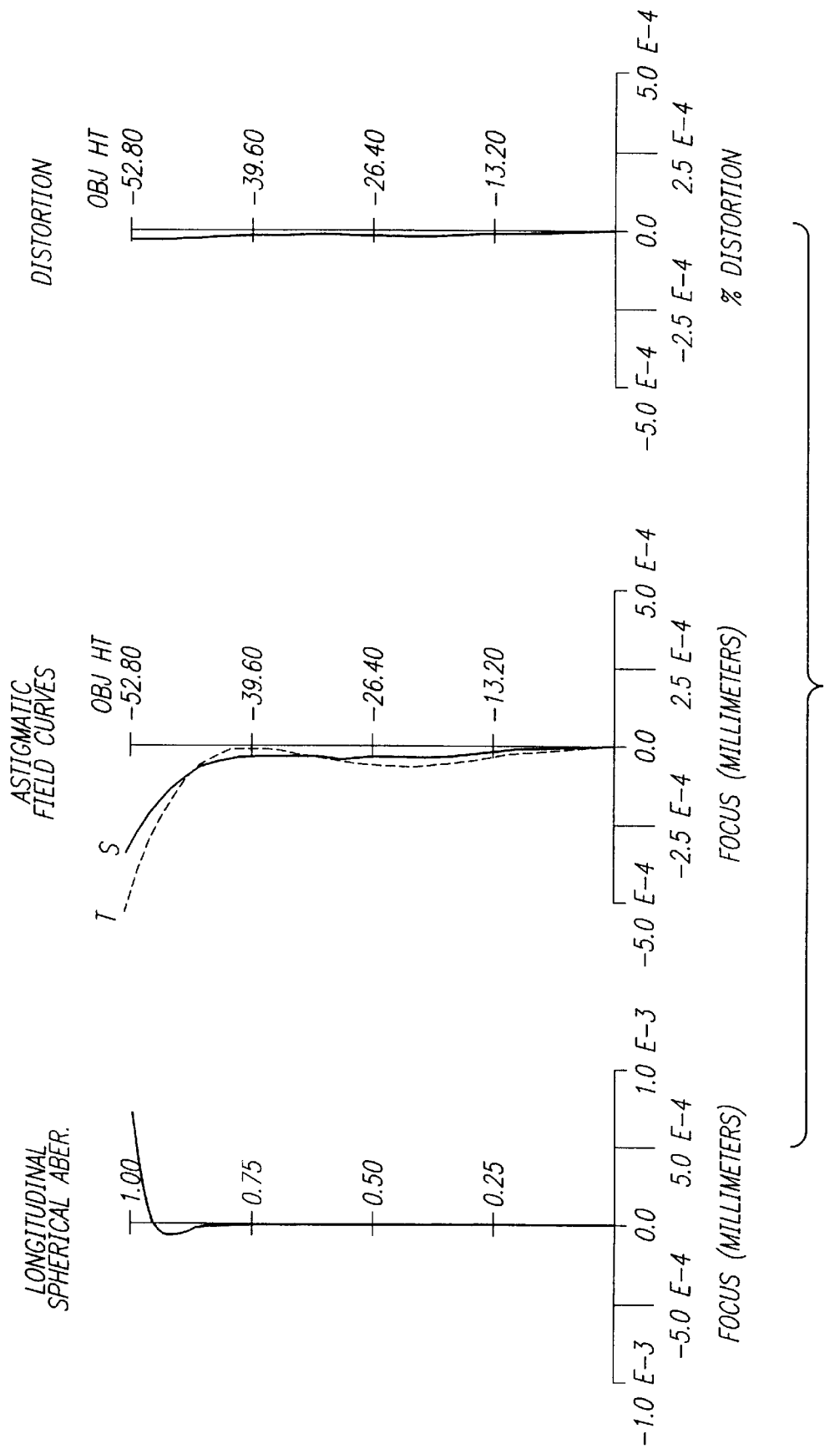
FIG. 3B shows the longitudinal spherical aberration, the astigmatic field curves, and the distortion of the projection lens system shown in FIG. 3A.

FIG. 3B shows the longitudinal spherical aberration, the astigmatic field curves, and the distortion of the projection lens system of the first embodiment.

Figure 3C:
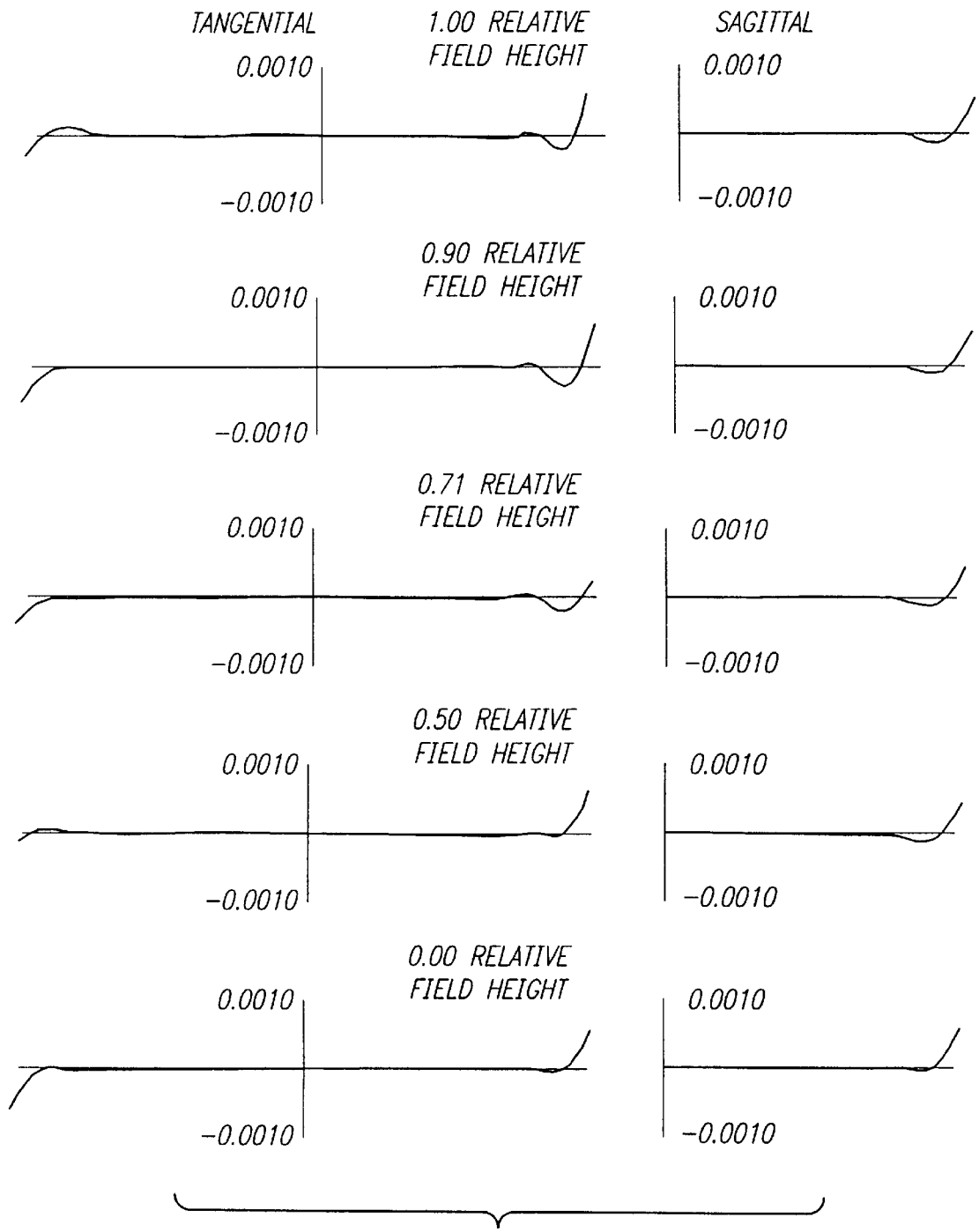
FIG. 3C shows the ray aberrations of the projection lens system shown in FIG. 3A for varying relative field heights all at a wavelength of 248.4 nanometers.

FIG. 3C shows the ray aberrations of the projection lens system of the first embodiment for varying relative field heights at a wavelength of 248.4 nanometers.

Table 3 below shows the values of specifications for the above third embodiment. The parameters are the same as described above for Table 1.

The optical material used in all lens elements in Table 3 is fused silica ($SiO_2$). All the lens elements have a refractive index of 1.508379 at a wavelength of 248.4 nm. As can be appreciated by one of ordinary skill in the art, the refractive index can vary slightly depending upon the grade of silica from which the lens element is manufactured and also depends upon the capability of the manufacturer of the lens element.

TABLE 3

Object plane to first optical surface = 100 mm
Last optical surface to image plane = 30.4 mm
$f_{G1}$ = 160.127 mm  $f_{G2}$ = −55.230 mm  $f_{G3}$ = 120.119 mm
$f_{G4}$ = −135.290 mm  $f_{G5}$ = 133.020 mm  F = 721.6l mm
L = 947.921 mm  $T_{G5}$ = 160.277 mm  $L_{G5}$ = 266.871 mm
$T_{G1-G5}$ = 507.442 mm  $L_{G1-G5}$ = 817.521 mm  $T_{G1-G5}/L$ = 0.5353
$T_{G5}/L_{G5}$ = 0.6006  $T_{G1-G5}/L_{G1-G5}$ = 0.6207  $h_{asp}/h_{max}$ = 0.212
Refractive index of all glass elements = 1.508379 @ a wavelength of 248.4 nm.
NA = 0.60  Exposure field size = 18.7 × 18.7 mm or an exposure field with a diameter of 26.45 mm
$r_i$ = 19.6 mm  $r_o$ = 85.1 mm  $r_i/r_o$ = 4.318
$f_{III}$ = 150 mm  $f_I$ = 160.127 mm  $f_{III}/f_I$ = 0.937

| Surface number | Radius of curvature (mm) | axial distance (mm) |
|---|---|---|
| 1 | 2265.27179 | 21.640451 |
| 2 | −339.80466 | 0.500000 |
| 3 | 482.60945 | 19.815943 |
| 4 | −513.43237 | 0.500000 |
| 5 | 297.28511 | 22.277346 |
| 6 | −500.64842 | 0.507230 |
| 7 | 244.67756 | 39.706568 |
| 8 | 90.13996 | 20.734206 |
| 9 | −198.94142 | 12.500000 |
| 10 | 116.94032 | 22.785188 |
| 11 | −104.15360 | 12.500000 |
| 12 | 558.88708 | 43.481726 |
| 13 | −1360.69681 | 35.127935 |
| 14* | −144.23023 | 0.592023 |
| *Aspheric constants: | | |
| k = −0.155228 | $A_1$ = 0.000000 | $A_2$ = −.204903 × $10^{-12}$ |
| | $A_3$ = −.741494 × $10^{-17}$ | $A_4$ = −.448612 × $10^{-21}$ |
| 15 | 1469.14372 | 34.145254 |
| 16 | −224.07257 | 0.500000 |
| 17 | 236.25249 | 38.140534 |
| 18 | −528.60765 | 0.500000 |
| 19 | 129.22733 | 41.310932 |
| 20 | 113.82504 | 20.736917 |
| 21 | INFINITY | 12.500000 |
| 22 | 138.86663 | 25.753978 |
| 23* | −149.32527 | 12.500000 |
| *Aspherical constants: | | |
| k = 1.226042 | $A_1$ = 0.000000 | $A_2$ = 0.296594 × $10^{-11}$ |
| | $A_3$ = 0.759924 × $10^{-15}$ | $A_4$ = 0.183884 × $10^{-19}$ |
| 24 | 196.66021 | 26.226328 |
| 25 | −122.32449 | 45.000000 |
| 26 | −120.23892 | 25.666094 |
| 27 (AS) | INFINITY | 15.001710 |

TABLE 3-continued

| | | |
|---|---|---|
| 28* | 264.48744 | 40.776135 |
| *Aspherical constants: | | |
| k = −4.147803 | $A_1 = 0.000000$ | $A_2 = 0.366830 \times 10^{-13}$ |
| | $A_3 = 0.672170 \times 10^{-17}$ | $A_4 = -.147266 \times 10^{-21}$ |
| 29 | −287.14987 | 37.805393 |
| 30 | 226.79195 | 30.868306 |
| 31 | INFINITY | 0.505442 |
| 32* | 191.67845 | 31.132091 |
| *Aspherical constants: | | |
| k = 1.242956 | $A_1 = 0.000000$ | $A_2 = -.414278 \times 10^{-12}$ |
| | $A_3 = -.194050 \times 10^{-16}$ | $A_4 = -.116377 \times 10^{-20}$ |
| 33 | 1624.73913 | 9.938007 |
| 34 | −501.74689 | 12.500000 |
| 35 | INFINITY | 58.345592 |
| 36 | 68.20216 | 45.000000 |
| 37* | 13688589 | 30.400162 |
| *Aspherical constants: | | |
| k = 6.463783 | $A_1 = 0.000000$ | $A_2 = -.400826 \times 10^{-10}$ |
| | $A_3 = -.162903 \times 10^{-13}$ | $A_4 = -.761430 \times 10^{-17}$ |
| IMG | INFINITY | 0.000000 |

Where all of the parameter definitions are the same as described above for Table 1.

Figure 4A:
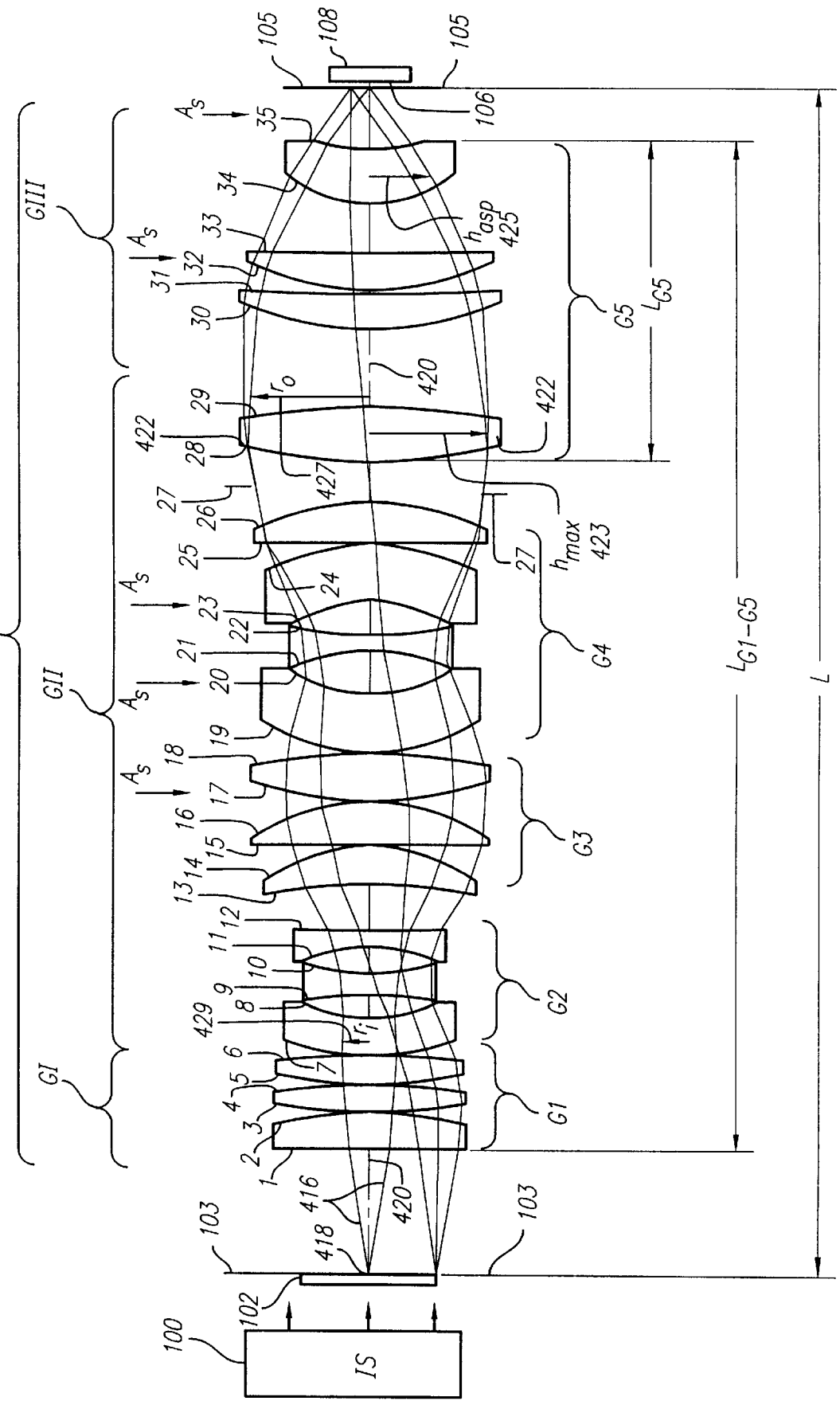
FIG. 4A is a schematic diagram of the projection lens system according to a fourth embodiment of the present invention.

Referring to FIG. 4A, a fourth embodiment of a projection lens system in accordance with the present invention is shown. The projection lens system 400, viewed from the object side, in order of succession, includes a first group of lens elements G1 with an overall positive refractive power, a second group of lens elements G2 with an overall negative refractive power, a third group of lens elements G3 with an overall positive refractive power, a fourth group of lens elements G4 with an overall negative refractive power, and a fifth group of lens elements with an overall positive refractive power. An aperture stop 27 is disposed between the fourth group of lens elements G4 and the fifth group of lens elements G5. The fifth group of lens elements G5 has two aspherical lens surfaces, 32 and 35.

The fifth group of lens elements G5 also satisfies the condition: $0.50 < T_{G5}/L_{G5} < 0.85$, where $T_{G5}$ is the sum of the axial thickness of each of the lens elements in the fifth group of lens elements G5 and $L_{G5}$ is the axial distance along the optical axis from the first lens surface in the fifth group of lens elements to the last lens surface in the fifth group of lens elements. If the above relationship is below the lower limit, if is difficult to adequately correct the optical aberrations at a numerical aperture of 0.6 and with an exposure field size of 18.7×18.7 mm or an exposure field with a diameter of 26.45 mm at the wafer plane. If the above relationship is above the upper limit, the projection lens system is too bulky and expensive since it includes more costly lens elements than necessary. More desirably, the projection lens system satisfies the condition: $0.59 < T_{G5}/L_{G5} < 0.78$ instead of the condition: $0.50 < T_{G5}/L_{G5} < 0.85$. As can be appreciated by one of skill in the projection exposure optical system art, there is a tradeoff between the size of the system and optical performance. Generally, the greater the number of expensive lens elements, the easier it is to obtain higher optical performance.

The projection lens system 400 satisfies the condition: $0.50 < T_{G1-G5}/L_{G1-G5} 0.64$, where $T_{G1-G5}$ is the sum of the axial thickness of each of the lens elements in the first group of lens elements G1 through the fifth group of lens elements G5 and $L_{G1-G5}$ is the total axial distance along the optical axis from the first lens surface in the first group of lens elements G1 to the last lens surface in the fifth group of lens elements G5. If the projection lens system is below the lower limit of the above relationship the optical aberrations are very difficult to correct and if the projection lens system is above the upper limit of the above relationship the apparatus will be too bulky and expensive.

The projection lens system 400 also satisfies the condition: $0.50 < T_{G1-G5}/L < 0.70$, where $T_{G1-G5}$ is the sum of the axial thickness of each of the lens elements in the first group of lens elements G1 through the fifth group of lens elements G5 and L is the axial distance from the reticle (object plane) to the wafer (image plane).

The projection lens system 400 shown in FIG. 4A has the traces 416 of light rays that originate on an axial point on the reticle 102, indicated at 418, reaching their furthest points from the optical axis 420 of the projection lens system when the traces are in the fifth group of lens elements G5. The furthest points are indicated at points 422 that are on lens surface 28.

The projection lens system 400 satisfies the condition: $0.21 < h_{asp}/h_{max} \leq 1$, where $h_{max}$ is the maximum distance between the optical axis 420 and the trace 416 of a marginal ray originating on the axial location 418 on the reticle 102. The maximum distance $h_{max}$ is shown at 423. The value $h_{asp}$ is the distance from the optical axis at which the trace 416 passes through the aspherical lens surface 35 in the fifth group of lens elements. The value $h_{asp}$ is shown at 425. The value of the condition: $0.21 < h_{max} \leq 1$ determines the most suitable location of an aspherical lens surface in the fifth group of lens elements. If the aspherical lens surface is not located at a location defined by the above condition, the corrections for optical aberrations would be substantially more difficult.

The projection lens system 400 also comprises a first major group of lens elements, $G_I$, that includes the first group of lens elements G1, a second major group of lens elements, $G_{II}$, that includes the second group of lens elements, G2, the third group of lens elements, G3, the fourth group of lens elements, G4, and the first lens element in the fifth group of lens elements, G5, and a third major group of lens elements, $G_{III}$, that includes all the lens elements in the fifth group of lens elements except the first lens element in the fifth group of lens elements.

The ratio of the height of the marginal ray $r_o$, indicated at 427, exiting the second major group of lens elements, $G_{II}$, to the height of the marginal ray $r_i$, indicated at 429, entering the second major group of lens elements, satisfies the condition:

$r_o/r_i \leq 4.34$.

If the ratio $r_o/r_i$ exceeds the limit, the diameter or lens elements in the third major group of lens elements has to be increased to accommodate the larger beam expansion. This would result in added cost and makes compensation for optical aberrations more difficult.

The ratio of the focal length $f_{III}$ of the third major group of lens elements, $G_{III}$, to the focal length $f_I$ of the first major group of lens elements, $G_I$, satisfies the condition:

$0.93 \leq f_{III}/f_I \leq 1.1$.

If the ratio $f_{III}/f_I$ is outside the above upper and lower limits, the axial length of either the first major group or the third major group of lens elements is increased which will, in turn, cause the overall length of the projection lens system to increase.

Figure 4B:
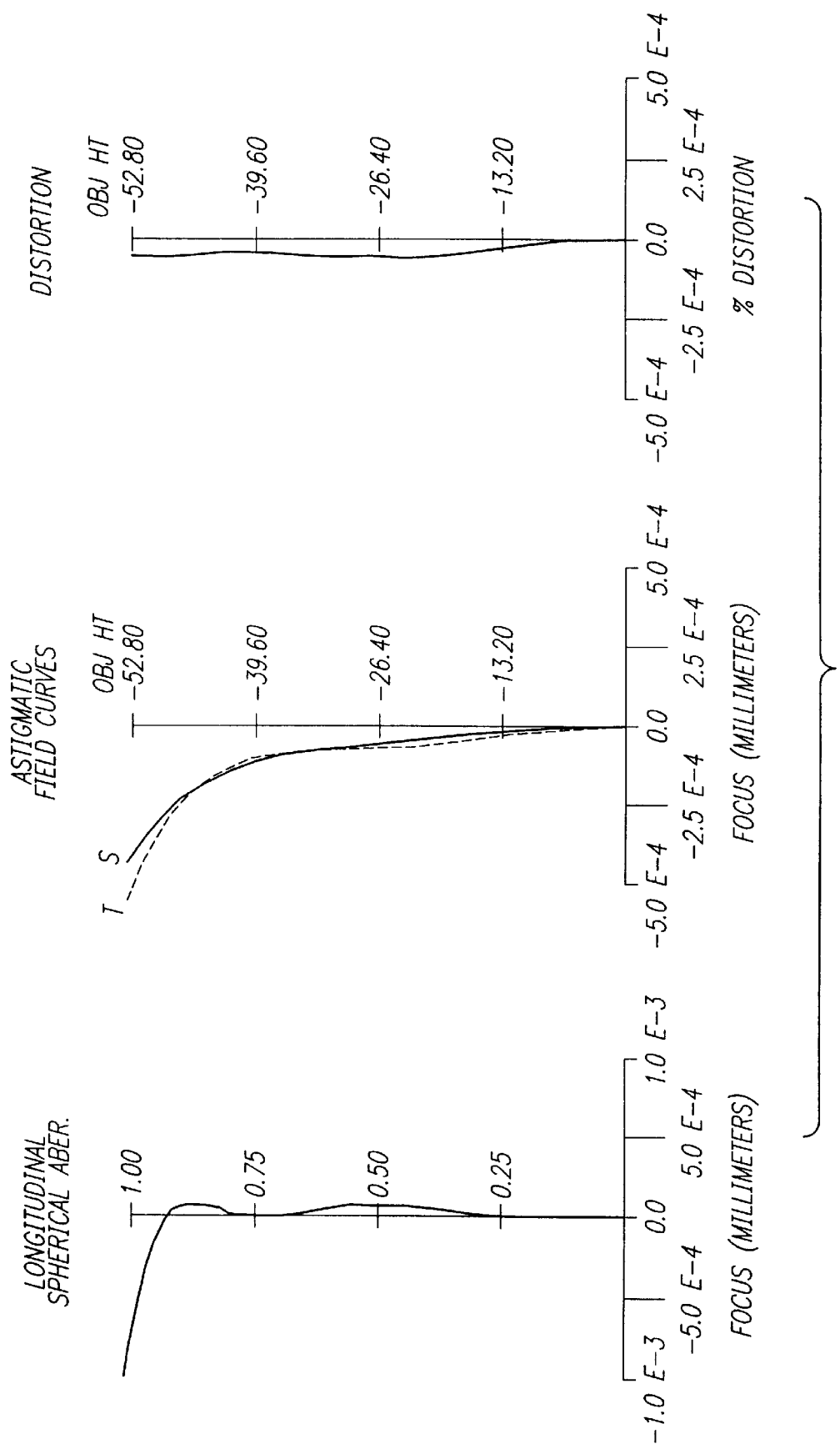
FIG. 4B shows the longitudinal spherical aberration, the astigmatic field curves, and the distortion of the projection lens system shown in FIG. 4A.

FIG. 4B shows the longitudinal spherical aberration, the astigmatic field curves, and the distortion of the projection lens system of the first embodiment.

Figure 4C:
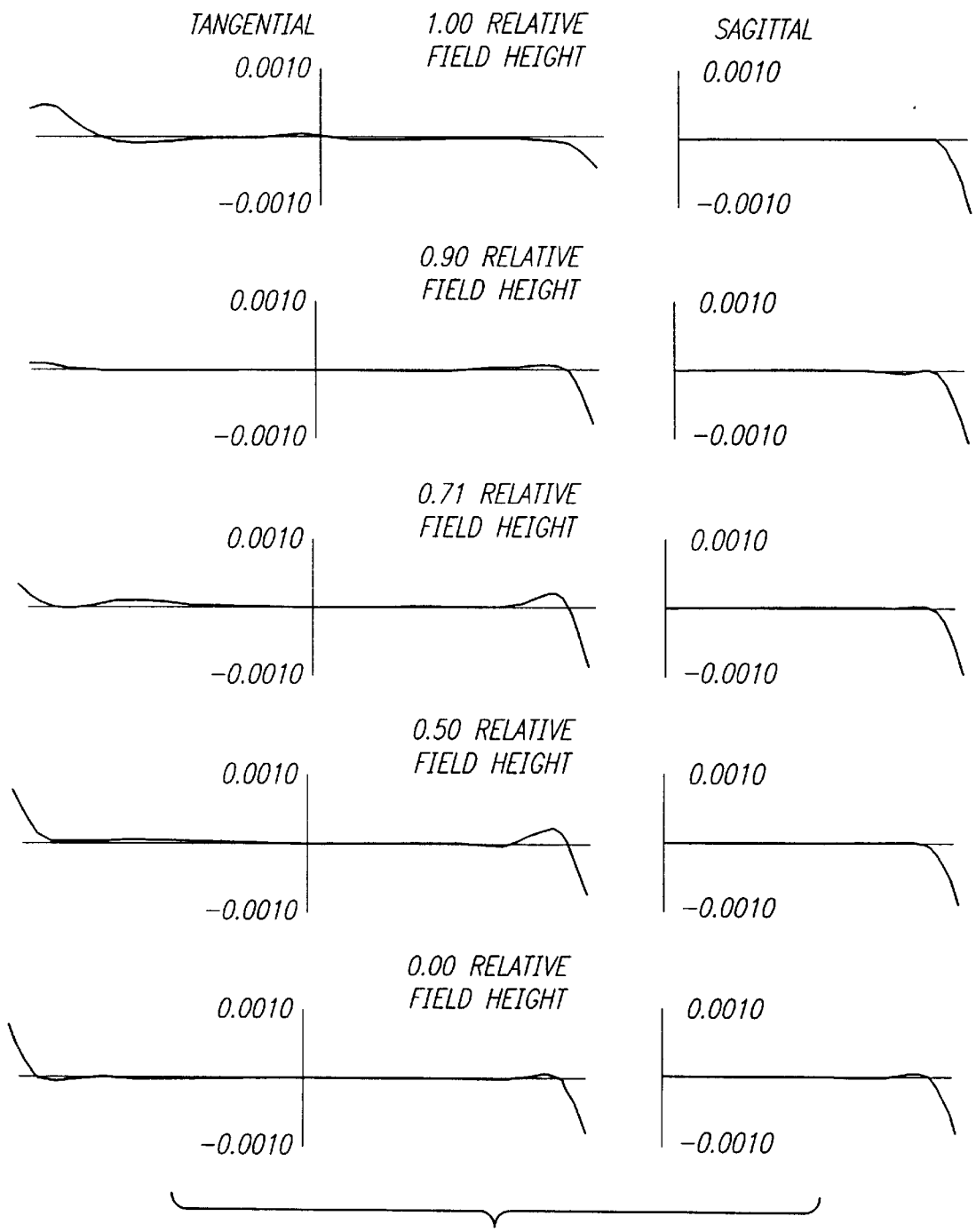
FIG. 4C shows the ray aberrations of the projection lens system shown in FIG. 4A for varying relative field heights all at a wavelength of 248.4 nanometers.

FIG. 4C shows the ray aberrations of the projection lens system of the first embodiment for varying relative field heights at a wavelength of 248.4 nanometers.

Table 4 below shows the values of specifications for the above fourth embodiment. The parameters are the same as described above for Table 1.

The optical material used in all lens elements in Table 4 is fused silica ($SiO_2$). All the lens elements have a refractive index of 1.508379 at a wavelength of 248.4 nm. As can be appreciated by one of ordinary skill in the art, the refractive index can vary slightly depending upon the grade of silica from which the lens element is manufactured and also depends upon the capability of the manufacturer of the lens element.

TABLE 4

Object plane to first optical surface = 100 mm
Last optical surface to image plane = 45.7 mm
$f_{G1}$ = 148.942 mm   $f_{G2}$ = −52.116 mm   $f_{G3}$ = 108.179 mm
$f_{G4}$ = −208.112 mm   $f_{G5}$ = 138.142 mm   F = 752.47 mm
L = 957 mm   $T_{G5}$ = 148.120 mm   $L_{G5}$ = 254.647 mm
$T_{G1-G5}$ = 515.185 mm   $L_{G1-G5}$ = 811.341 mm   $T_{G1-G5}/L$ = 0.538
$T_{G5}/L_{G5}$ = 0.582   $T_{G1-G5}/L_{G1-G5}$ = 0.635   $h_{asp}/h_{max}$ = 0.322
Refractive index of all glass elements = 1.508379 @ a wavelength of 248.4 nm.
NA = 0.60   Exposure field size = 18.7 × 18.7 mm or an exposure field with a diameter of 26.45 mm
$r_i$ = 20.447 mm   $r_o$ = 85.95 mm   $r_i/r_o$ = 4.204
$f_{III}$ = 146.585 mm   $f_I$ = 148.942 mm   $f_{III}/f_I$ = 0.984

| Surface number | Radius of curvature (mm) | axial distance (mm) |
|---|---|---|
| 1 | INFINITY | 31.064832 |
| 2 | −319.19804 | 0.500000 |
| 3 | 372.77743 | 21.522479 |
| 4 | −527.12987 | 0.533269 |
| 5 | 257.97242 | 25.026431 |
| 6 | −458.07687 | 0.500000 |
| 7 | 192.89255 | 29.600874 |
| 8 | 94.04524 | 20.189604 |
| 9 | −203.47606 | 12.500000 |
| 10 | 101.26386 | 25.350411 |
| 11 | −88.69592 | 12.500000 |
| 12 | 477.36249 | 38.837673 |
| 13 | −388.59866 | 29.772526 |
| 14 | −128.56968 | 0.500000 |
| 15 | INFINITY | 34.828818 |
| 16 | −169.79089 | 0.500000 |
| 17* | 164.20812 | 37.451141 |

*Aspherical constants:
k = −2.661869   $A_1$ = 0.000000   $A_2$ = −.255048 × $10^{-11}$
$A_3$ = 0.147406 × $10^{-15}$   $A_4$ = −.118805 × $10^{-20}$

| | | |
|---|---|---|
| 18 | −580.70477 | 0.534351 |
| 19 | 154.44848 | 43.662169 |
| 20* | 65.57053 | 38.696552 |

*Aspherical constants:
k = −.549080   $A_1$ = 0.000000   $A_2$ = −.115666 × $10^{-10}$
$A_2$ = −.124625 × $10^{-14}$   $A_4$ = −.355418 × $10^{-19}$

| | | |
|---|---|---|
| 21 | −202.76784 | 12.500000 |
| 22 | 177.36456 | 29.169335 |
| 23* | −113.08003 | 44.958063 |

*Aspherical constants:
k = −0.224114   $A_1$ = 0.000000   $A_2$ = −.100718 × $10^{-11}$
$A_3$ = −.571948 × $10^{-16}$   $A_4$ = −.799517 × $10^{-20}$

| | | |
|---|---|---|
| 24 | −174.96085 | 1.384213 |
| 25 | INFINITY | 31.688913 |
| 26 | −190.86857 | 15.033183 |
| 27 (AS) | INFINITY | 17.888360 |
| 28 | 323.24389 | 42.918832 |
| 29 | −944.48687 | 62.962549 |
| 30 | 198.47214 | 29.623820 |
| 31 | 1011.70055 | 1.355644 |
| 32* | 176.37025 | 31.055074 |

*Aspherical constants:
k = −.265654   $A_1$ = 0.000000   $A_2$ = 0.233923 × $10^{-12}$
$A_3$ = −.821880 × $10^{-17}$   $A_4$ = −.783936 × $10^{-21}$

| | | |
|---|---|---|
| 33 | 581.83982 | 42.219436 |
| 34 | 85.86514 | 44.511162 |
| 35* | 177.65131 | 45.659429 |

*Aspherical constants:
k = 5.748911   A1 = 0.000000   A2 = −.964512 × $10^{-11}$
A3 = −.144424 × $10^{-14}$   A4 = −.830129 × $10^{-18}$

| | | |
|---|---|---|
| IMG | INFINITY | |

Where all of the parameter definitions are the same as described above for Table 1.

Figure 5A:
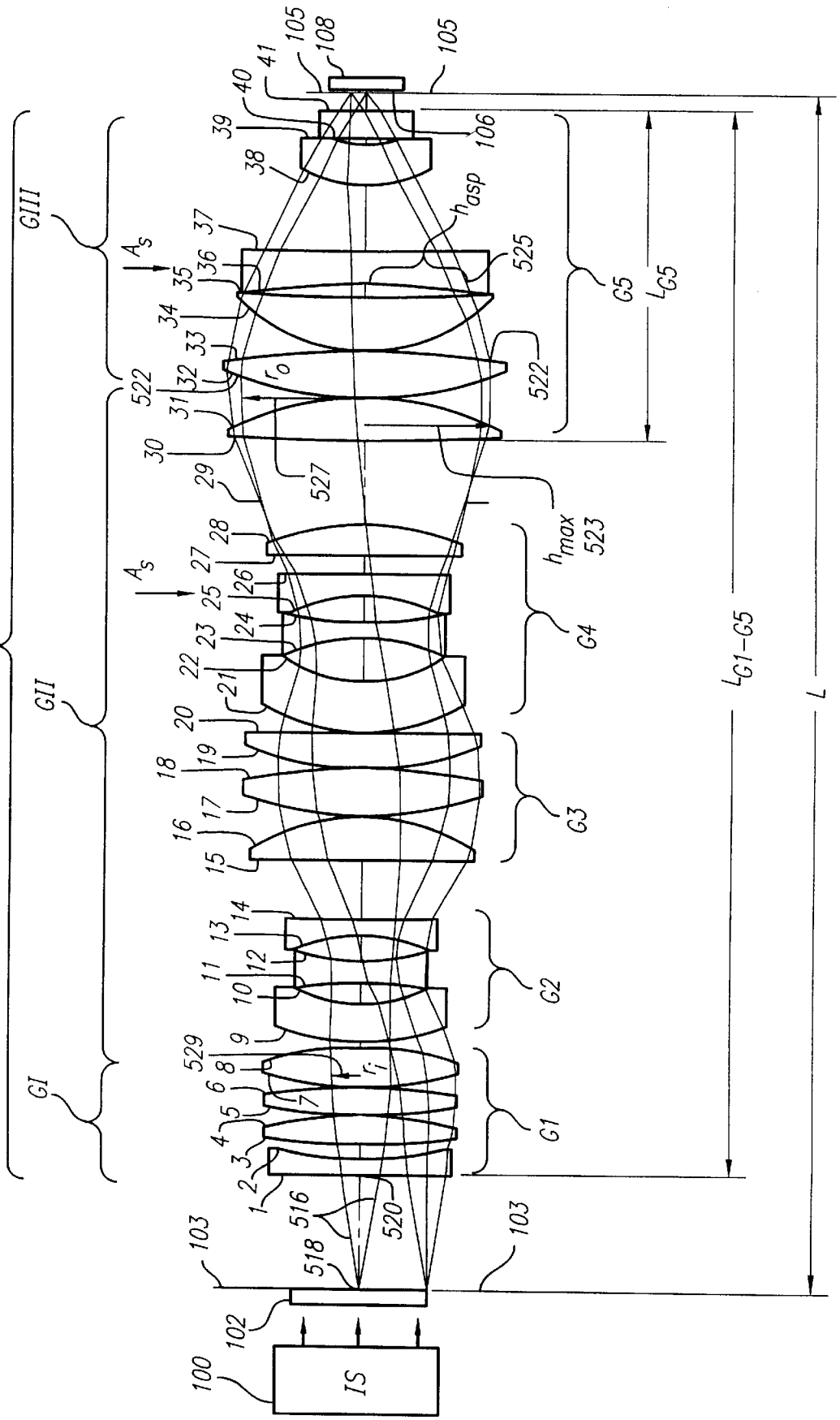
FIG. 5A is a schematic diagram of the projection lens system according to a fifth embodiment of the present invention.

Referring to FIG. 5A, there is shown a fifth embodiment of a projection lens system in accordance with the present invention. The projection lens system 500, viewed from the object side, in order of succession, includes a first group of lens elements G1 with an overall positive refractive power, a second group of lens elements G2 with an overall negative refractive power, a third group of lens elements G3 with an overall positive refractive power, a fourth group of lens elements G4 with an overall negative refractive power, and a fifth group of lens elements with an overall positive refractive power. An aperture stop 29 is disposed between the fourth group of lens elements G4 and the fifth group of lens elements G5. The fifth group of lens elements G5 has one aspherical lens surface, 35.

The fifth group of lens elements G5 also satisfies the condition: $0.50 < T_{G5}/L_{G5} < 0.85$, where $T_{G5}$ is the sum of the axial thickness of each of the lens elements in the fifth group of lens elements G5 and $L_{G5}$ is the axial distance along the optical axis from the first lens surface in the fifth group of lens elements to the last lens surface in the fifth group of lens elements. If the above relationship is below the lower limit, it is difficult to adequately correct the optical aberrations at a numerical aperture of 0.6 and with an exposure field size of 18.7×18.7 mm or an exposure field with a diameter of 26.45 mm at the wafer plane. If the above relationship is above the upper limit, the projection lens system is too bulky and expensive since it includes more lens elements than necessary. More desirably, the projection lens system satisfies the condition: $0.59 < T_{G5}/L_{G5} < 0.78$ instead of the condition: $0.50 < T_{G5}/L_{G5} < 0.85$. As can be appreciated by one of skill in the projection exposure optical systems art, there is a tradeoff between the number of lens elements in the optical system and the optical performance of the optical system. Normally, the greater the number of expensive lens elements, the easier it is to obtain higher optical performance.

The projection lens system 500 satisfies the condition: $0.50 < T_{G1-G5}/L_{G1-G5} < 0.64$, where $T_{G1-G5}$ is the sum of the axial thickness of each of the lens elements in the first group of lens elements G1 through the fifth group of lens elements G5 and $L_{G1-G5}$ is the total axial distance along the optical axis from the first lens surface in the first group of lens elements G1 to the last lens surface in the fifth group of lens elements G5. If the projection lens system is below the lower limit of the above relationship the optical aberrations are very difficult to correct and if the projection lens system is above the upper limit of the above relationship the apparatus will be too bulky and expensive.

The projection lens system 500 also satisfies the condition: $0.50 < T_{G1-G5}/L < 0.70$, where $T_{G1-G5}$ is the sum of the axial thicknesses along the optical axis of each of the lens elements in the first group of lens elements G1 through the fifth group of lens elements G5 and L is the axial distance from the reticle (object plane) to the wafer (image plane).

The projection lens system 500 shown in FIG. 5A has the traces 516 of light rays that originate on an axial point on the reticle, indicated at 518, reaching their furthest points from the optical axis 520 of the projection lens system when the traces are in the fifth group of lens elements G5. The furthest points are indicated at points 522 that are on lens surface 32.

The projection lens system 500 satisfies the condition: $0.21 < h_{asp}/h_{max} \leq 1$, where $h_{max}$ is the maximum distance between the optical axis 520 and the trace 516 of a marginal ray originating on the axial location 518 on the reticle 102. The maximum distance $h_{max}$ is shown at 523. The value $h_{asp}$ is the distance from the optical axis at which the trace 516 passes through the aspherical lens surface 35 in the fifth group of lens elements. The value $h_{asp}$ is shown at 525. The value of the condition: $0.21 < h_{asp}/h_{max} \leq 1$ determines the most suitable location of an aspherical lens surface in the fifth group of lens elements. If the aspherical lens surface is not located at a location defined by the above condition, the corrections for optical aberrations would be substantially more difficult.

The projection lens system 500 also comprises a first major group of lens elements, $G_I$, that includes the first group of lens elements G1, a second major group of lens elements, $G_{II}$, that includes the second group of lens elements, G2, the third group of lens elements, G3, the fourth group of lens elements, G4, and the first lens element in the fifth group of lens elements, G5, and a third major group of lens elements, $G_{III}$, that includes all the lens elements in the fifth group of lens elements except the first lens element in the fifth group of lens elements.

The ratio of the height of the marginal ray $r_o$, indicated at 527, exiting the second major group of lens elements, $G_{II}$, to the height of the marginal ray $r_i$, indicated at 529, entering the second major group of lens elements, satisfies the condition:

$r_o/r_i \leq 4.34$.

If the ratio $r_o/r_i$ exceeds the limit, the diameter or lens elements in the third major group of lens elements has to be increased to accommodate the larger beam expansion. This would result in added cost and makes compensation for optical aberrations more difficult.

The ratio of the focal length $f_{III}$ of the third major group of lens elements, $G_{III}$, to the focal length $f_I$ of the first major group of lens elements, $G_I$, satisfies the condition:

$0.93 \leq f_{III}/f_I \leq 1.1$.

If the ratio $f_{III}/f_I$ is outside the above upper and lower limits, the axial length of either the first major group or the third major group of lens elements is increased which will, in turn, cause the overall length of the projection lens system to increase.

Figure 5B:
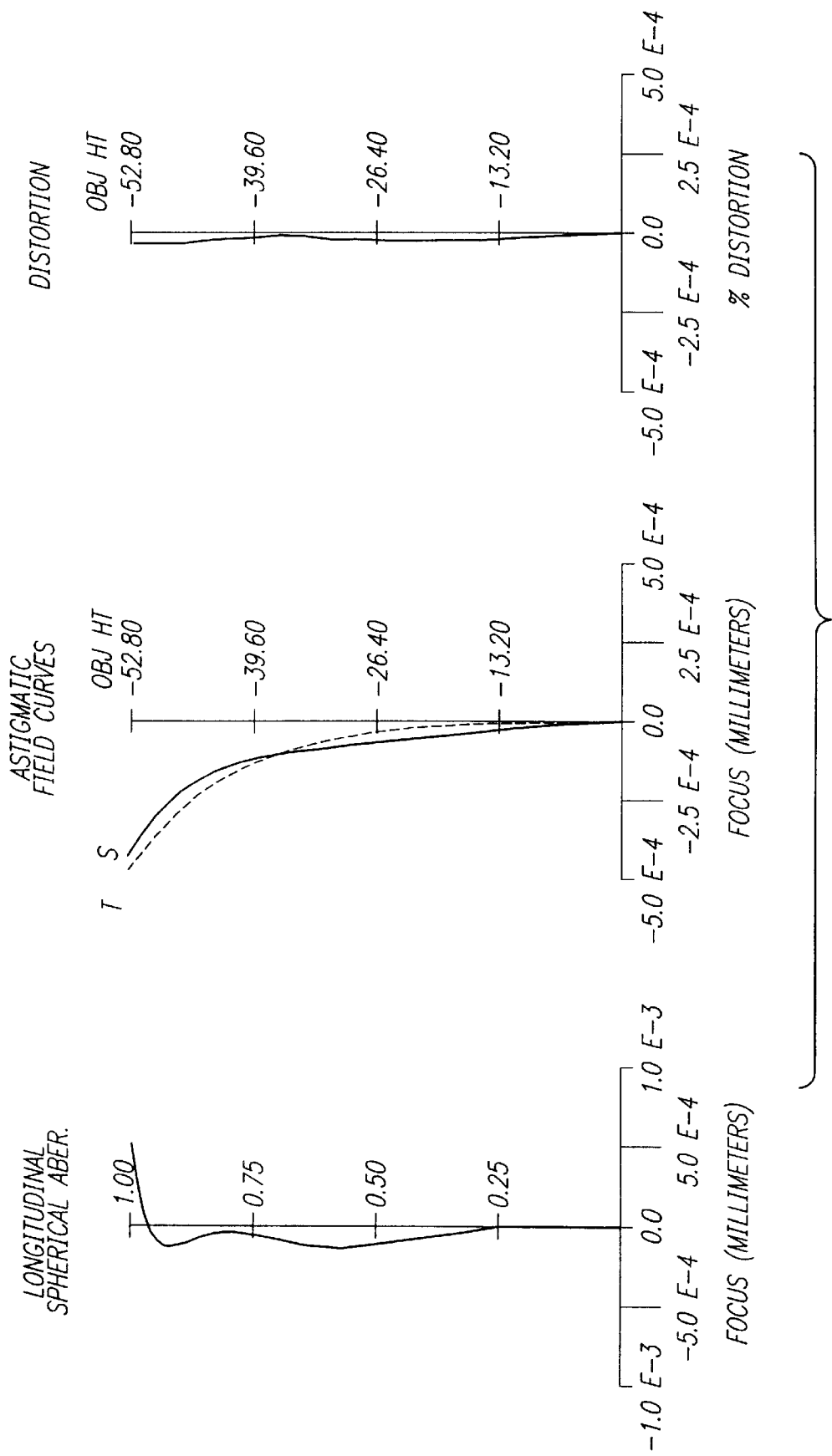
FIG. 5B shows the longitudinal spherical aberration, the astigmatic field curves, and the distortion of the projection lens system shown in FIG. 5A.

FIG. 5B shows the longitudinal spherical aberration, the astigmatic field curves, and the distortion of the projection lens system of the first embodiment.

Figure 5C:
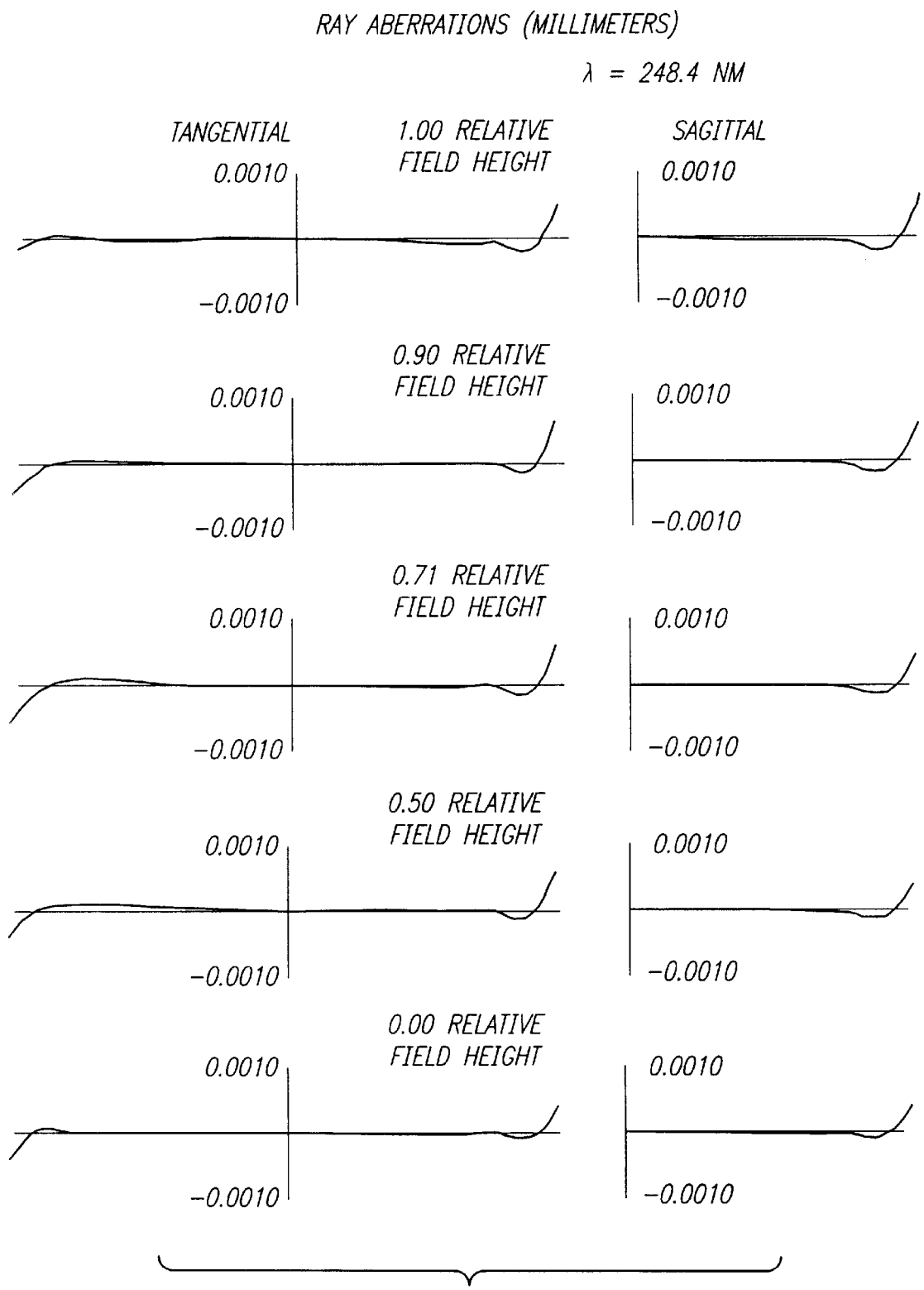
FIG. 5C shows the ray aberrations of the projection lens system shown in FIG. 5A for varying relative field heights all at a wavelength of 248.4 nanometers.

FIG. 5C shows the ray aberrations of the projection lens system of the first embodiment for varying relative field heights at a wavelength of 248.4 nanometers.

Table 5 below shows the values of specifications for the above first embodiment. The parameters are the same as described above for Table 1.

The optical material used in all lens elements in Table 5 is fused silica (SiO$_2$). All the lens elements have a refractive index of 1.508379 at a wavelength of 248.4 nm. As can be appreciated by one of ordinary skill in the art, the refractive index can vary slightly depending upon the grade of silica from which the lens element is manufactured and also depends upon the capability of the manufacturer of the lens element.

TABLE 5

Object plane to first optical surface = 100 mm
Last optical surface to image plane = 15 mm
$f_{G1}$ = 156.135 mm    $f_{G2}$ = -60.020 mm    $f_{G3}$ = 128.482 mm
$f_{G4}$ = -137.222 mm   $f_{G5}$ = 126.607 mm    F = 724.860 mm
L = 1000 mm              $T_{G5}$ = 200.861 mm    $L_{G5}$ = 273.331 mm
$T_{G1-G5}$ = 543.312 mm $L_{G1-G5}$ = 885.000 mm $T_{G1-G5}/L$ = 0.543
$T_{G5}/L_{G5}$ = 0.735  $T_{G1-G5}/L_{G1-G5}$ = 0.614  $h_{asp/hmax}$ = 0.787
Refractive index of all glass elements = 1.508379 @ a
wavelength of 248.4 nm.
NA = 0.60                Exposure field size = 18.7 × 18.7 mm or an
                         exposure field with a diameter of 26.45 mm
$r_i$ = 23.862 mm        $r_o$ = 95.853 mm        $r_i/r_o$ = 4.204
$f_{III}$ = 155.75 mm    $f_I$ = 156.135 mm       $f_{III}/f_I$ = 0.998

TABLE 5-continued

| Surface number | Radius of curvature (mm) | axial distance (mm) |
|---|---|---|
| 1 | INFINITY | 12.500000 |
| 2 | 242.45543 | 11.901451 |
| 3 | 523.34812 | 25.803003 |
| 4 | -260.42208 | 0.571650 |
| 5 | 751.47064 | 18.161301 |
| 6 | -691.38443 | 0.567617 |
| 7 | 214.08891 | 33.402776 |
| 8 | -294.00765 | 7.707797 |
| 9 | 225.55406 | 29.656696 |
| 10 | 101.98730 | 20.846916 |
| 11 | -240.00452 | 12.500000 |
| 12 | 125.76214 | 23.095969 |
| 13 | -112.80432 | 12.500000 |
| 14 | 325.00930 | 56.353855 |
| 15 | INFINITY | 37.842296 |
| 16 | -153.10472 | 0.534776 |
| 17 | 320.52016 | 34.344395 |
| 18 | -449.19096 | 0.500000 |
| 19 | 214.97055 | 27.921348 |
| 20 | 1750.64986 | 0.500000 |
| 21 | 127.11401 | 41.248269 |
| 22 | 92.86094 | 33.145657 |
| 23 | -223/01006 | 12.500000 |
| 24 | 149.08126 | 26.927815 |
| 25* | -131.01590 | 17.779720 |
| *Aspherical constants | | |
| k = 0.126500 | $A_1$ = 0.000000 | $A_2$ = 0.653855 × 10$^{-12}$ |
| | $A_3$ = -.425098 × 10$^{-17}$ | $A_4$ = -.760847 × 10$^{-20}$ |
| 26 | 949.33234 | 17.386703 |
| 27 | INFINITY | 26.291296 |
| 28 | -212.82720 | 15.021418 |
| 29 (AS) | INFINITY | 54.155436 |
| 30 | 1183.61305 | 35.578138 |
| 31 | -250.76790 | 0.585444 |
| 32 | 286.36467 | 37.260794 |
| 33 | -749.99677 | 0.502610 |
| 34 | 134.09081 | 43.525058 |
| 35* | 636.06254 | 12.086100 |
| *Aspherical constants | | |
| k = 8.855726 | $A_1$ = 0.000000 | $A_2$ = -.700941 × 10$^{-12}$ |
| | $A_3$ = -.128246 × 10$^{-16}$ | $A_4$ = -.119516 × 10$^{-21}$ |
| 36 | -804.77784 | 26.858931 |
| 37 | 1458.66326 | 54.507205 |
| 38 | 79.04295 | 36.170213 |
| 39 | 173.82937 | 4.789257 |
| 40 | -704.11819 | 21.467883 |
| 41 | INFINITY | 15.000086 |
| IMG | INFINITY | 0.000000 |

Where all of the parameter definitions are the same as described above for Table 1.

Figure 6A:
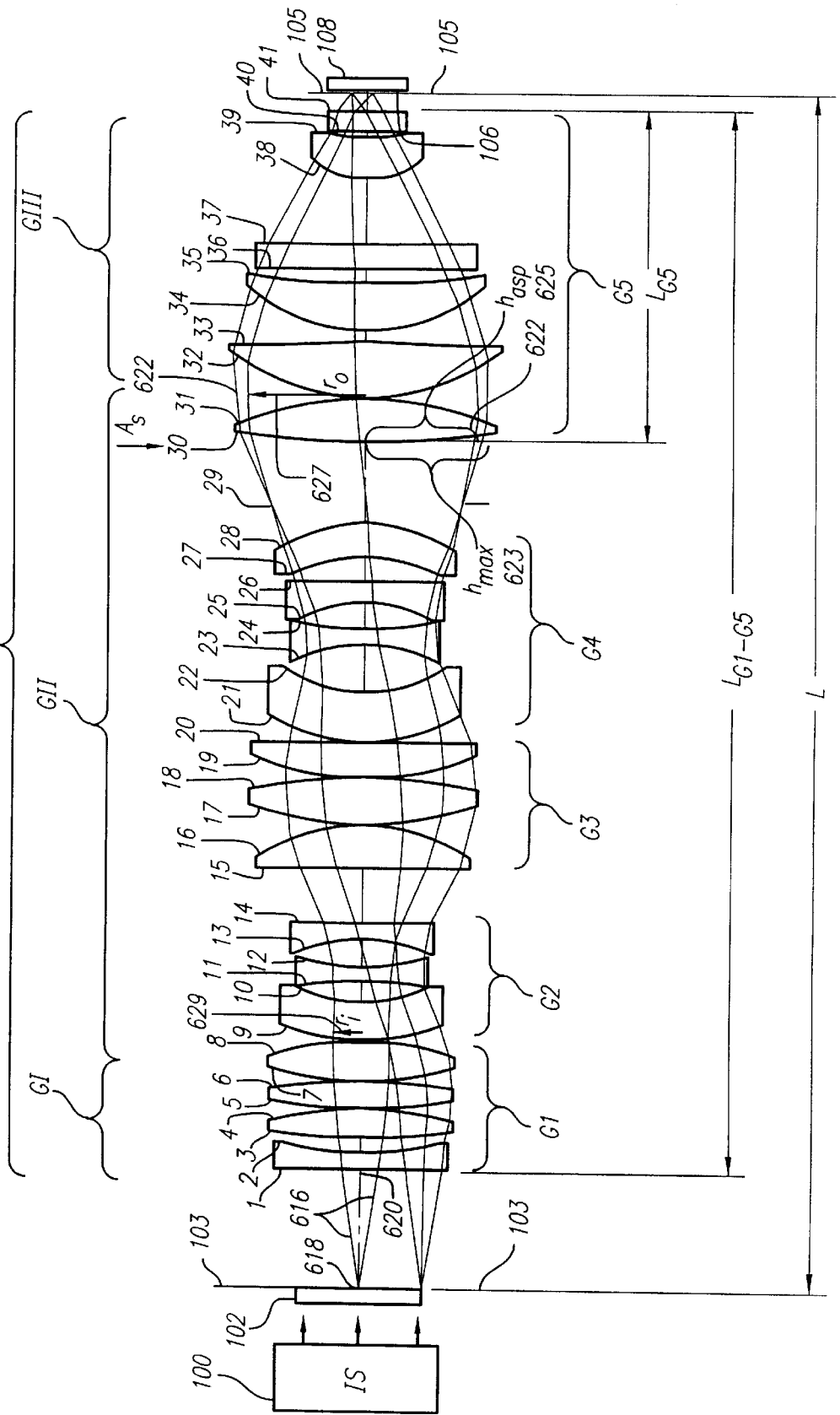
FIG. 6A is a schematic diagram of the projection lens system according to a sixth embodiment of the present invention.

Referring to FIG. 6A, there is shown a sixth embodiment of a projection lens system in accordance with the present invention. The projection lens system 600, viewed from the object side, in order of succession, includes a first group of lens elements G1 with an overall positive refractive power, a second group of lens elements G2 with an overall negative refractive power, a third group of lens elements G3 with an overall positive refractive power, a fourth group of lens elements G4 with an overall negative refractive power, and a fifth group of lens elements with an overall positive refractive power. An aperture stop 29 is disposed between the fourth group of lens elements G4 and the fifth group of lens elements G5. The fifth group of lens elements G5 has one aspherical lens surface, 30.

The fifth group of lens elements G5 also satisfies the condition: $0.50 < T_{G5}/L_{G5} < 0.85$, where $T_{G5}$ is the sum of the axial thickness of each of the lens elements in the fifth group of lens elements G5 and $L_{G5}$ is the total axial distance along the optical axis from the first lens surface in the fifth group of lens elements to the last lens surface in the fifth group of lens elements. If the above relationship is below the lower limit, it is difficult to adequately correct the optical aberrations at a numerical aperture of 0.6 and with an exposure field size of 18.7×18.7 mm or an exposure field with a diameter of 26.45 mm at the wafer plane. If the above relationship is above the upper limit, the projection lens system is too bulky and expensive since it includes more lens elements than necessary. More desirably, the projection lens system satisfies the condition: $0.59<T_{G5}/L_{G5}<0.78$ instead of the condition: $0.50<T_{G5}/L_{G5}<0.85$. As can be appreciated by one of skill in the projection exposure optical system art, there is a tradeoff between the size of the system and optical performance. Normally, the greater the number of expensive lens elements, the easier it is to obtain higher optical performance.

The projection lens system 600 satisfies the condition: $0.50<T_{G1-G5}/L_{G1-G5}<0.64$, where $T_{G1-G5}$ is the sum of the axial thickness of each of the lens elements in the first group of lens elements G1 through the fifth group of lens elements G5 and $L_{G1-G5}$ is the total axial distance along the optical axis from the first lens surface in the first group of lens elements G1 to the last lens surface in the fifth group of lens elements G5. If the projection lens system is below the lower limit of the above relationship the optical aberrations are very difficult to correct and if the projection lens system is above the upper limit of the above relationship the apparatus will be too bulky and expensive.

The projection lens system 600 also satisfies the condition: $0.50<T_{G1-G5}/L<0.70$, where $T_{G1-G5}$ is the sum of the axial thickness of each of the lens elements in the first group of lens elements G1 through the fifth group of lens elements G5 and L is the axial distance from the reticle (object plane) to the wafer (image plane).

The projection lens system 600 shown in FIG. 6A has the traces 616 of light rays that originate on an axial point on the reticle, indicated at 618, reaching their furthest points from the optical axis 620 of the projection lens system when the traces are in the fifth group of lens elements G5. The furthest points are indicated at points 622 that are on lens surface 31.

The projection lens system 600 satisfies the condition: $0.21<h_{asp}/h_{max} \leq 1$, where $h_{max}$ is the maximum distance between the optical axis 620 and the trace 616 of a marginal ray originating on the axial location 618 on the reticle 102. The maximum distance $h_{max}$ is shown at 623. The value $h_{asp}$ is the distance from the optical axis at which the trace 616 passes through the aspherical lens surface 30 in the fifth group of lens elements. The value $h_{asp}$ is shown at 625. The value of the condition: $0.21<h_{asp}/h_{max} \leq 1$ determines the most suitable location of an aspherical lens surface in the fifth group of lens elements. If the aspherical lens surface is not located at a location defined by the above condition, the corrections for optical aberrations would be substantially more difficult.

The projection lens system 600 also comprises a first major group of lens elements, $G_I$, that includes the first group of lens elements G1, a second major group of lens elements, $G_{II}$, that includes the second group of lens elements, G2, the third group of lens elements, G3, the fourth group of lens elements, G4, and the first lens element in the fifth group of lens elements, G5, and a third major group of lens elements, $G_{III}$, that includes all the lens elements in the fifth group of lens elements except the first lens element in the fifth group of lens elements.

The ratio of the height of the marginal ray $r_o$, indicated at 627, exiting the second major group of lens elements, $G_{II}$, to the height of the marginal ray $r_i$, indicated at 629, entering the second major group of lens elements, satisfies the condition:

$r_o/r_i \leq 4.34$.

If the ratio $r_o/r_i$ exceeds the limit, the diameter or lens elements in the third major group of lens elements has to be increased to accommodate the larger beam expansion. This would result in added cost and makes compensation for optical aberrations more difficult.

The ratio of the focal length $f_{III}$ of the third major group of lens elements, $G_{III}$, to the focal length $f_I$ of the first major group of lens elements, $G_I$, satisfies the condition:

$0.93 \leq f_{III}/f_I \leq 1.1$.

If the ratio $f_{III}/f_I$ is outside the above upper and lower limits, the axial length of either the first major group or the third major group of lens elements is increased which will, in turn, cause the overall length of the projection lens system to increase.

Figure 6B:
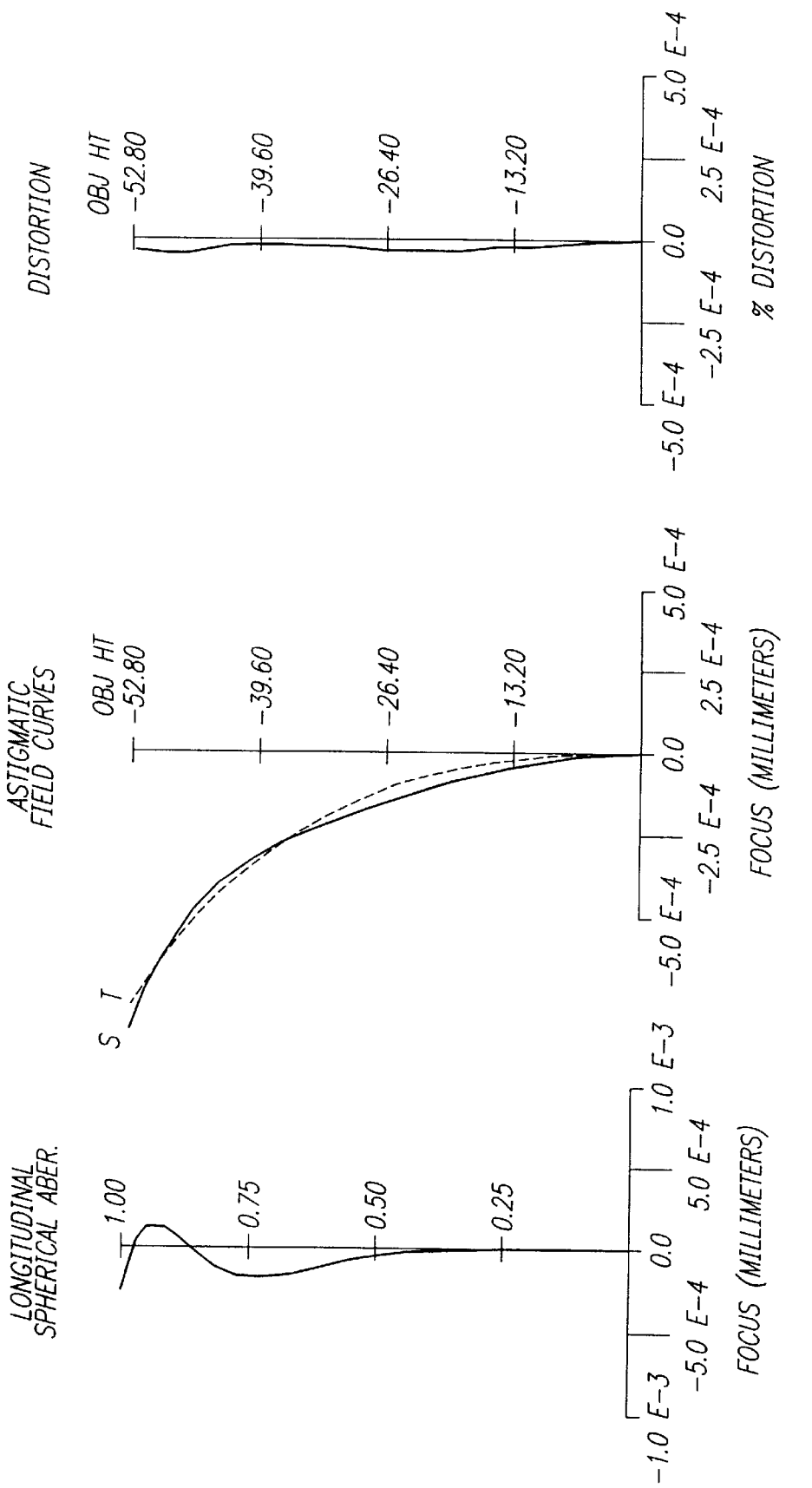
FIG. 6B shows the longitudinal spherical aberration, the astigmatic field curves, and the distortion of the projection lens system shown in FIG. 6A.

FIG. 6B shows the longitudinal spherical aberration, the astigmatic field curves, and the distortion of the projection lens system of the first embodiment.

Figure 6C:
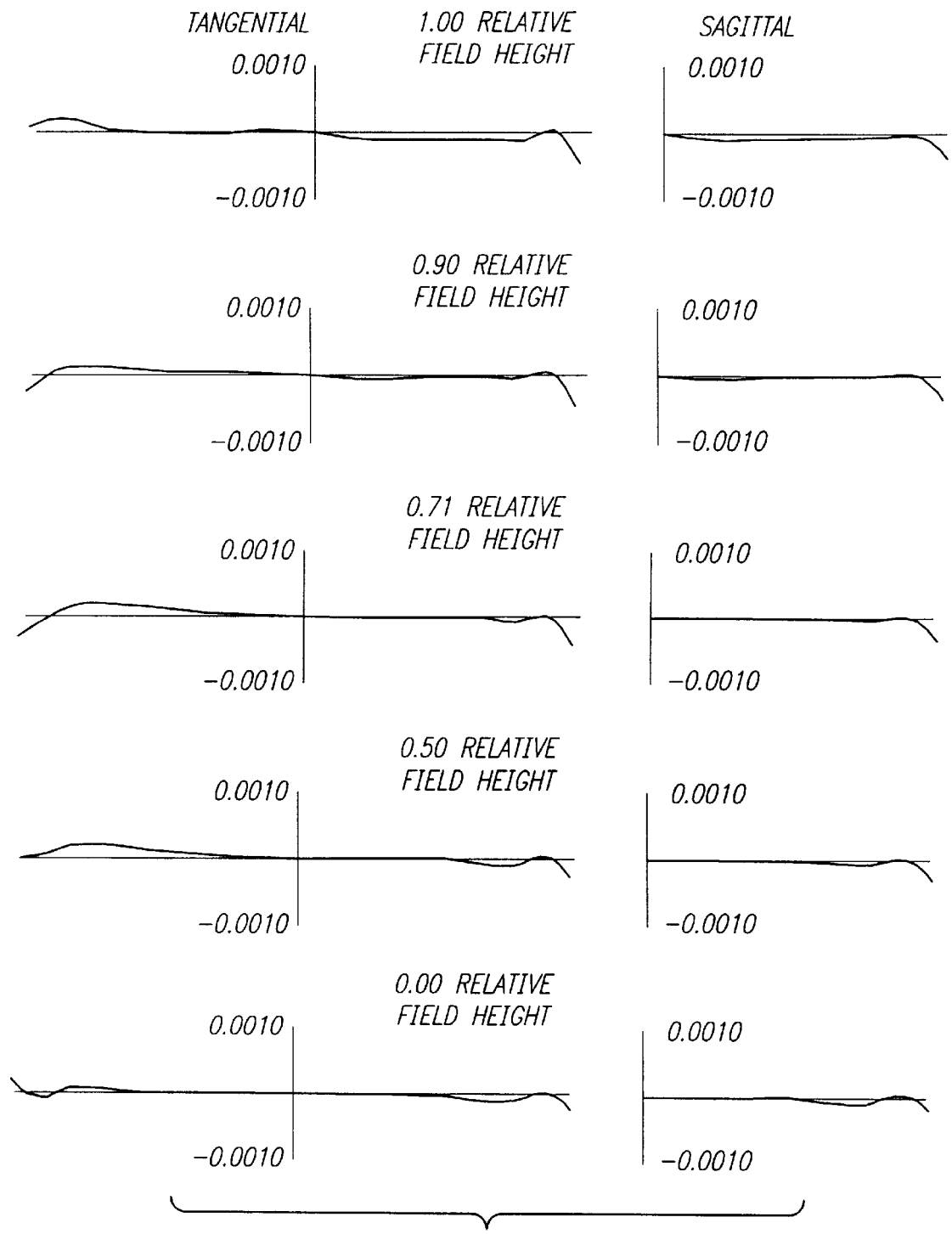
FIG. 6C shows the ray aberrations of the projection lens system shown in FIG. 6A for varying relative field heights all at a wavelength of 248.4 nanometers.

FIG. 6C shows the ray aberrations of the projection lens system of the first embodiment for varying relative field heights at a wavelength of 248.4 nanometers.

Table 6 below shows the values of specifications for the above first embodiment. The parameters are the same as described above for Table 1.

The optical material used in all lens elements in Table 6 is fused silica ($SiO_2$). All the lens elements have a refractive index of 1.508379 at a wavelength of 248.4 nm. As can be appreciated by one of ordinary skill in the art, the refractive index can vary slightly depending upon the grade of silica from which the lens element is manufactured and also depends upon the capability of the manufacturer of the lens elements.

TABLE 6

Object plane to first optical surface = 100 mm
Last optical surface to image plane = 15 mm
$f_{G1}$ = 149.215 mm     $f_{G2}$ = -58.595 mm      $f_{G3}$ = 126.070 mm
$f_{G4}$ = -123.838 mm    $f_{G5}$ = 126.988 mm      F = 734.160 mm
L = 1000 mm               $T_{G5}$ = 190.757 mm      $L_{G5}$ = 274.256 mm
$T_{G1-G5}$ = 533.065 mm  $L_{G1-G5}$ = 855.000 mm   $T_{G1-G5}/L$ = 0.533
$T_{G5}/L_{G5}$ = 0.696   $T_{G1-G5}/L_{G1-G5}$ = 0.602   $h_{asp}/h_{max}$ = 0.955
Refractive index of all glass elements = 1.508379 @ a wavelength of 248.4 nm.
NA = 0.6                  Exposure field size = 18.7 × 18.7 mm or
                          an exposure field with a diameter of 26.45 mm
$r_i$ = 23.875 mm         $r_o$ = 96.8 mm            $r_i/r_o$ = 4.054
$f_{III}$ = 160.4 mm      $f_I$ = 149.215 mm         $f_{III}/f_I$ = 1.075

| Surface number | Radius of curvature (mm) | axial distance (mm) |
|---|---|---|
| 1 | INFINITY | 12.500000 |
| 2 | 255.47664 | 13.744932 |
| 3 | 579.54107 | 24.120539 |
| 4 | -296.97293 | 0.500000 |
| 5 | 360.30213 | 23.921751 |
| 6 | -518.01320 | 0.500000 |
| 7 | 235.20616 | 30.575786 |
| 8 | -337.02120 | 0.528888 |
| 9 | 196.15240 | 26.071860 |
| 10 | 96.11026 | 23.742112 |
| 11 | -211.74969 | 12.500000 |
| 12 | 116.25733 | 24.318888 |
| 13 | -117.53209 | 12.500000 |
| 14 | 358.01887 | 50.364862 |
| 15 | INFINITY | 35.833599 |
| 16 | -159.69404 | 0.500000 |
| 17 | 283.91436 | 37.327486 |
| 18 | -420.55889 | 0.500000 |
| 19 | 285.13866 | 29.027762 |
| 20 | -1063.25179 | 0.500000 |
| 21 | 144.16855 | 41.101311 |

TABLE 6-continued

| | | |
|---|---|---|
| 22 | 103.83866 | 37.283660 |
| 23 | −179.98749 | 12.500000 |
| 24 | 200.31244 | 28.121268 |
| 25 | −134.92586 | 16.515898 |
| 26 | INFINITY | 19.038971 |
| 27 | −165.44424 | 27.812632 |
| 28 | −131.30012 | 15.000000 |
| 29 | INFINITY | 53.792433 |
| 30* | 500.80585 | 38.098540 |
| *Aspherical constants: | | |
| k = 0.000000 | $A_1 = -.181127 \times 10^{-7}$ | $A_2 = 0.108199 \times 10^{-12}$ |
| | $A_3 = -.298983 \times 10^{-17}$ | $A_4 = -.174140 \times 10^{-22}$ |
| 31 | −273.98140 | 0.500000 |
| 32 | 190.01133 | 44.447155 |
| 33 | INFINITY | 9.384077 |
| 34 | 144.32353 | 39.178462 |
| 35 | 464.62668 | 13.230201 |
| 36 | INFINITY | 19.014945 |
| 37 | 776.69431 | 55.495151 |
| 38 | 74.82933 | 34.114139 |
| 39 | 162.06080 | 4.889893 |
| 40 | −442.98277 | 15.903481 |
| 41 | INFINITY | 15.000109 |
| IMG | INFINITY | 0.000000 |

Where all of the parameter definitions are the same as described above for Table 1.

As those skilled in the art of projection optical systems will readily appreciate, numerous substitutions, modifications and additions may be made to the above design without departing from the spirit and scope of the present invention. It is intended that all such substitutions, modifications and additions fall within the scope of this invention that is best defined by the claims appended below.

What is claimed is:

1. A projection exposure apparatus for transferring a pattern on a reticle onto a wafer, the apparatus comprising:
   a support for holding a reticle;
   a support for holding a wafer;
   an illuminating system for illuminating the pattern on the reticle;
   a projection lens system for projecting an image of the pattern on the reticle onto the wafer;
   wherein the projection lens system comprises in order from an object side to an image side:
   a first group of lens elements having a positive refractive power;
   a second group of lens elements having a negative refractive power;
   a third group of lens elements having a positive refractive power;
   a fourth group of lens elements having a negative refractive power;
   a fifth group of lens elements having a positive refractive power; and
   wherein the fifth group of lens elements includes at least one aspherical lens surface and wherein the fifth group of lens elements satisfies the following condition:
   $0.59 < T_{G5}/L_{G5} < 0.78$,
   where $T_{G5}$ is the sum of the axial thicknesses of the lens elements in the fifth group of lens elements, and where $L_{G5}$ is the total axial distance from the first lens surface in the fifth group of lens elements to the last lens surface in the fifth group of lens elements.

2. The projection exposure apparatus of claim 1, wherein the apparatus further satisfies the condition:
   $0.5 < T_{G1-G5}/L_{G1-G5} < 0.64$,
   where $T_{G1-G5}$ is the sum of the axial thicknesses of the lens elements in the first through fifth group of lens elements, and where $L_{G1-G5}$ is the total axial distance from the first lens surface in the first group of lens elements to the last lens surface in the fifth group of lens elements; and
   wherein an aperture stop is disposed between the fourth group of lens elements and the fifth group of lens elements.

3. The projection exposure apparatus of claim 2, wherein the apparatus further satisfies the condition:
   $0.5 < T_{G1-G5}/L < 0.70$,
   where $T_{G1-G5}$ is the sum of the axial thicknesses of the lens elements in the first through fifth group of lens elements, and where L is the total axial distance from the reticle to the wafer.

4. The projection exposure apparatus of claim 3, wherein a trace of a light ray originating from an axial point on the reticle is furthest from an optical axis of the projection exposure apparatus when the trace is in the fifth group of lens elements.

5. The projection exposure apparatus of claim 4, wherein the apparatus satisfies the condition:
   $0.21 < h_{asp}/h_{max} \leq 1$,
   where $h_{max}$ is a maximum distance between the optical axis and the trace of a marginal ray originating on an axial location on the reticle and $h_{asp}$ is the distance from the optical axis at which the trace passes through an aspherical lens surface in the fifth group of lens elements.

6. The projection exposure apparatus of claim 2, wherein a trace of a light ray originating from an axial point on the reticle is furthest from an optical axis of the projection exposure apparatus when the trace is in the fifth group of lens elements.

7. The projection exposure apparatus of claim 6, wherein the apparatus satisfies the condition:
   $0.2 < h_{asp}/h_{max} \leq 1$,
   where $h_{max}$ is a maximum distance between the optical axis and the trace of a marginal ray originating on an axial location on the reticle and $h_{asp}$ is a distance from the optical axis at which the trace passes through an aspherical lens surface in the fifth group of lens elements.

8. The projection exposure apparatus of claim 2, wherein the projection lens system further comprises:
   a first major group of lens elements wherein the first major group of lens elements includes the first group of lens elements;
   a second major group of lens elements wherein the second major group of lens elements includes the second group of lens elements, the third group of lens elements, the fourth group of lens elements, and the first lens element in the fifth group of lens elements; and
   a third major group of lens elements wherein the third major group of lens elements includes the lens elements in the fifth group of lens elements not including the first lens element in the fifth group of lens elements;
   wherein the projection lens system satisfies the condition:
   $r_o/r_i \leq 4.34$,
   where $r_o$ is the height of a marginal ray exiting the second major group of lens elements and $r_i$ is the height of the marginal ray entering the second major group of lens elements.

9. The projection exposure apparatus of claim 8, wherein the projection lens system satisfies the condition:
   $0.93 \leq f_{III}/f_I \leq 1.1$,
   where $f_{III}$ is the focal length of the third major group of lens elements and $f_I$ is the focal length of the first major group of lens elements.

10. The projection exposure apparatus of claim 1, wherein the apparatus further satisfies the condition:

$0.5 < T_{G1-G5}/L < 0.70$, where $T_{G1-G5}$ is the sum of the axial thicknesses of the lens elements in the first through fifth group of lens elements, and where L is the total axial distance from the reticle to the wafer; and wherein an aperture stop is disposed between the fourth group of lens elements and the fifth group of lens elements.

11. The projection exposure apparatus of claim 10, wherein a trace of a light ray originating from an axial point on the reticle is furthest from an optical axis of the projection exposure apparatus when the trace is in the fifth group of lens elements.

12. The projection exposure apparatus of claim 11, wherein the apparatus satisfies the condition:

$0.21 < h_{asp}/h_{max} \leq 1$, where $h_{max}$ is a maximum distance between the optical axis and the trace of a marginal ray originating on an axial location on the reticle and $h_{asp}$ is the distance from the optical axis at which the trace passes through an aspherical lens surface in the fifth group of lens elements.

13. The projection exposure apparatus of claim 12, wherein the projection lens system further comprises:

a first major group of lens elements wherein the first major group of lens elements includes the first group of lens elements;

a second major group of lens elements wherein the second major group of lens elements includes the second group of lens elements, the third group of lens elements, the fourth group of lens elements, and the first lens element in the fifth group of lens elements; and a third major group of lens elements wherein the third major group of lens elements includes the lens elements in the fifth group of lens elements not including the first lens element in the fifth group of lens elements;

wherein the projection lens system satisfies the condition:
$r_o/r_i \leq 4.34$, where $r_o$ is the height of a marginal ray exiting the second major group of lens elements and ri is the height of the marginal ray entering the second major group of lens elements.

14. The projection exposure apparatus of claim 13, wherein the projection lens system satisfies the condition:

$0.93 \leq f_{III}/f_I \leq 1.1$, where $f_{III}$ is the focal length of the third major group of lens elements and $f_I$ is the focal length of the first major group of lens elements.

15. The projection exposure apparatus of claim 1:

wherein a trace of a light ray originating from an axial point on the reticle is furthest from an optical axis of the projection exposure apparatus when the trace is in the fifth group of lens elements; and wherein an aperture stop is disposed between the fourth group of lens elements and the fifth group of lens elements.

16. The projection exposure apparatus of claim 15, wherein the apparatus satisfies the condition:

$0.21 < h_{asp}/h_{max} \leq 1$, where $h_{max}$ is a maximum distance between the optical axis and the trace of a marginal ray originating on an axial location on the reticle and $h_{asp}$ is the distance from the optical axis at which the trace passes through an aspherical lens surface in the fifth group of lens elements.

17. The projection exposure apparatus of claim 1 wherein the projection lens system has a numerical aperture which is $\geq 0.6$.

18. The projection exposure apparatus of claim 11 wherein the projection lens system has an exposure field size which is $\geq 26.45$ mm diameter at the wafer plane.

19. The projection exposure apparatus of claim 1:

wherein the illuminating system comprises an excimer laser illumination source; and wherein an aperture stop is disposed between the fourth group of lens elements and the fifth group of lens elements.

20. The projection exposure apparatus of claim 1, wherein the projection lens system further comprises:

a first major group of lens elements wherein the first major group of lens elements includes the first group of lens elements;

a second major group of lens elements wherein the second major group of lens elements includes the second group of lens elements, the third group of lens elements, the fourth group of lens elements, and the first lens element in the fifth group of lens elements; and a third major group of lens elements wherein the third major group of lens elements includes the lens elements in the fifth group of lens elements not including the first lens element in the fifth group of lens elements;

wherein the projection lens system satisfies the condition:
$r_o/r_i \leq 4.34$ where $r_o$ is the height of a marginal ray exiting the second major group of lens elements and ri is the height of the marginal ray entering the second major group of lens elements.

21. The projection exposure apparatus of claim 20, wherein the projection lens system satisfies the condition:

$0.93 \leq f_{III}/f_I \leq 1.1$, where $f_{III}$ is the focal length of the third major group of lens elements and $f_I$ is the focal length of the first major group of lens elements.

22. A projection exposure apparatus for transferring a pattern on a reticle onto a wafer, the apparatus comprising:

a support for holding a reticle;

a support for holding a wafer;

an illuminating system for illuminating the pattern on the reticle;

a projection lens system for projecting an image of the pattern on the reticle onto the wafer;

wherein the projection lens system comprises in order from an object side to an image side:

a first group of lens elements having a positive refractive power;

a second group of lens elements having a negative refractive power;

a third group of lens elements having a positive refractive power;

a fourth group of lens elements having a negative refractive power;

a fifth group of lens elements having a positive refractive power and at least one aspherical lens surface; and wherein the apparatus satisfies the condition:
$0.5 < T_{G1-G5}/L_{G1-G5} < 0.64$, where $T_{G1-G5}$ is the sum of the axial thicknesses of the lens elements in the first through fifth group of lens elements, and where $L_{G1-G5}$ is the total axial distance from the first lens surface in the first group of lens elements to the last lens surface in the fifth group of lens elements.

23. The projection exposure apparatus of claim 22:
wherein the apparatus further satisfies the condition:
$0.5 < T_{G1-G5}/L < 0.70$,
where $T_{G1-G5}$ is the sum of the axial thicknesses of the lens elements in the first through fifth group of lens elements, and where L is the total axial distance from the reticle to the wafer; and
   wherein an aperture stop is disposed between the fourth group of lens elements and the fifth group of lens elements.

24. The projection exposure apparatus of claim 23, wherein a trace of a light ray originating from an axial point on the reticle is furthest from an optical axis of the projection exposure apparatus when the trace is in the fifth group of lens elements.

25. The projection exposure apparatus of claim 24, wherein the apparatus satisfies the condition:
$0.21 < h_{asp}/h_{max} \leq 1$,
where $h_{max}$ is a maximum distance between the optical axis and the trace of a marginal ray originating on an axial location on the reticle and $h_{asp}$ is the distance from the optical axis at which the trace passes through an aspherical lens surface in the fifth group of lens elements.

26. The projection exposure apparatus of claim 22:
   wherein a trace of a light ray originating from an axial point on the reticle is furthest from an optical axis of the projection exposure apparatus when the trace is in the fifth group of lens elements; and
   wherein an aperture stop is disposed between the fourth group of lens elements and the fifth group of lens elements.

27. The projection exposure apparatus of claim 26, wherein the apparatus satisfies the condition:
$0.21 < h_{asp}/h_{max} \leq 1$,
where $h_{max}$ is a maximum distance between the optical axis and the trace of a marginal ray originating on an axial location on the reticle and $h_{asp}$ is the distance from the optical axis at which the trace passes through an aspherical lens surface in the fifth group of lens elements.

28. The projection exposure apparatus of claim 22 wherein the projection lens system has a numerical aperture which is $\geq 0.6$.

29. The projection exposure apparatus of claim 28 wherein the projection lens system has an exposure field size which is $\geq 26.45$ mm diameter at the wafer plane.

30. The projection exposure apparatus of claim 22:
   wherein the illuminating system comprises an excimer laser illumination source; and
   wherein an aperture stop is disposed between the fourth group of lens elements and the fifth group of lens elements.

31. A projection exposure apparatus for transferring a pattern on a reticle onto a wafer, the apparatus comprising:
   a support for holding a reticle;
   a support for holding a wafer;
   an illuminating system for illuminating the pattern on the reticle;
   a projection lens system for projecting an image of the pattern on the reticle onto the wafer;
   wherein the projection lens system comprises in order from an object side to an image side:
      a first group of lens elements having a positive refractive power;
      a second group of lens elements having a negative refractive power;
      a third group of lens elements having a positive refractive power;
      a fourth group of lens elements having a negative refractive power;
      a fifth group of lens elements having a positive refractive power and at least one aspherical lens surface; and
   wherein the apparatus satisfies the conditions;
      $0.5 < T_{G1-G5}/L < 0.70$ and $0.5 < T_{G1-G5}/L_{G1-G5} < 0.64$,
   where $T_{G1-G5}$ is the sum of the axial thicknesses of the lens elements in the first through fifth group of lens elements, where L is the total axial distance from the reticle to the wafer, and where $L_{G1-G5}$ is the total axial distance from the first lens surface in the first group of lens elements to the last lens surface in the fifth group of lens elements.

32. The projection exposure apparatus of claim 31 wherein the projection lens system has a numerical aperture which is $\geq 0.6$.

33. The projection exposure apparatus of claim 32 wherein the projection lens system has an exposure field size which is $\geq 26.45$ mm diameter at the wafer plane.

34. The projection exposure apparatus of claim 31:
   wherein the illuminating system comprises an excimer laser illumination source; and
   wherein an aperture stop is disposed between the fourth group of lens elements and the fifth group of lens elements.

35. A method of transferring a pattern on a reticle onto a wafer, the method comprising:
   illuminating a pattern on a reticle;
   projecting the pattern through a projection lens system onto a wafer;
   wherein projecting the pattern through the projection lens system includes:
   projecting the pattern through a first group of lens elements having a positive refractive power;
   projecting the pattern through a second group of lens elements having a negative refractive power;
   projecting the pattern through a third group of lens elements having a positive refractive power;
   projecting the pattern through a fourth group of lens elements having a negative refractive power;
   projecting the pattern through a fifth group of lens elements having a positive refractive power, at least one aspherical lens surface, and that satisfies the following condition:
      $0.59 < T_{G5}/L_{G5} < 0.78$,
   where $T_{G5}$ is the sum of the axial thicknesses of the lens elements in the fifth group of lens elements, and where $L_{G5}$ is the total axial distance from the first lens surface in the fifth group of lens elements to the last lens surface in the fifth group of lens elements.

36. The method of claim 35, wherein projecting the pattern through a projection lens system further comprises:
   projecting the pattern through a projection lens system that satisfies the condition:
      $0.5 < T_{G1-G5}/L_{G1-G5} < 0.64$,
   where $T_{G1-G5}$ is the sum of the axial thicknesses of the lens elements in the first through fifth group of lens elements, and where $L_{G1-G5}$ is the total axial distance from the first lens surface in the first group of lens elements to the last lens surface in the fifth group of lens elements; and
   projecting the pattern through an aperture stop disposed between the fourth group of lens elements and the fifth group of lens elements.

37. The method of claim 36, wherein projecting the pattern through a projection lens system further comprises projecting the pattern through a projection lens system that satisfies the condition:

$0.5<T_{G1-G5}/L<0.70$, where $T_{G1-G5}$ is the sum of the axial thicknesses of the lens elements in the first through fifth group of lens elements, and where L is the total axial distance from the reticle to the wafer.

38. The method of claim 37, wherein projecting the pattern through the fifth group of lens elements includes projecting the pattern through the fifth group of lens elements wherein a trace of a light ray originating from an axial point on the reticle is furthest from an optical axis of the projection lens system.

39. The method of claim 38, wherein projecting the pattern through a projection lens system includes projecting the pattern through the fifth group of lens elements that satisfy the condition:

$0.21<h_{asp}/h_{max}\leq 1$, where $h_{max}$ is a maximum distance between the optical axis and the trace of a marginal ray originating on an axial location on the reticle and $h_{asp}$ is a distance from the optical axis at which the trace passes through an aspherical lens surface in the fifth group of lens elements.

40. The method of claim 35, wherein projecting the pattern through a projection lens system further comprises:
projecting the pattern through a projection lens system that satisfies the condition:

$0.5<T_{G1-G5}/L<0.70$, where $T_{G1-G5}$ is the sum of the axial thicknesses of the lens elements in the first through fifth group of lens elements, and where L is the total axial distance from the reticle to the wafer; and projecting the pattern through an aperture stop disposed between the fourth group of lens elements and the fifth group of lens elements.

41. The method of claim 40, wherein projecting the pattern through the fifth group of lens elements includes projecting the pattern through the fifth group of lens elements wherein a trace of a light ray originating from an axial point on the reticle is furthest from an optical axis of the projection lens system.

42. The method of claim 41, wherein projecting the pattern through a projection lens system includes projecting the pattern through the fifth group of lens elements that satisfy the condition:

$0.21<h_{asp}/h_{max}\leq 1$, where $h_{max}$ is a maximum distance between the optical axis and the trace of a marginal ray originating on an axial location on the reticle and $h_{asp}$ is a distance from the optical axis at which the trace passes through an aspherical lens surface in the fifth group of lens elements.

43. The method of claim 35, wherein projecting the pattern through the fifth group of lens elements includes:
projecting the pattern through the fifth group of lens elements wherein a trace of a light ray originating from an axial point on the reticle is furthest from an optical axis of the projection lens system; and projecting the pattern through an aperture stop disposed between the fourth group of lens elements and the fifth group of lens elements.

44. The method of claim 43, wherein projecting the pattern through a projection lens system includes projecting the pattern through the fifth group of lens elements that satisfy the condition:

$0.21<h_{asp}/h_{max}\leq 1$, where $h_{max}$ is a maximum distance between the optical axis and the trace of a marginal ray originating on an axial location on the reticle and $h_{asp}$ is a distance from the optical axis at which the trace passes through an aspherical lens surface in the fifth group of lens elements.

45. The method of claim 35, wherein projecting the pattern through a projection lens system includes:
projecting the pattern through the fifth group of lens elements that satisfy the condition:

$0.21<h_{asp}/h_{max}\leq 1$, where $h_{max}$ is a maximum distance between the optical axis and the trace of a marginal ray originating on an axial location on the reticle and $h_{asp}$ is a distance from the optical axis at which the trace passes through an aspherical lens surface in the fifth group of lens elements; and projecting the pattern through an aperture stop disposed between the fourth group of lens elements and the fifth group of lens elements.

46. The method of claim 35, wherein illuminating a pattern on a reticle includes illuminating the pattern on a reticle with an excimer laser.

47. A method of transferring a pattern on a reticle onto a wafer, the method comprising:
illuminating a pattern on a reticle;

projecting the pattern through a projection lens system onto a wafer;

wherein projecting the pattern through the projection lens system includes:

projecting the pattern through a first group of lens elements having a positive refractive power;

projecting the pattern through a second group of lens elements having a negative refractive power;

projecting the pattern through a third group of lens elements having a positive refractive power;

projecting the pattern through a fourth group of lens elements having a negative refractive power;

projecting the pattern through a fifth group of lens elements having a positive refractive power and at least one aspherical lens surface; and wherein the projection lens system satisfies the condition:

$0.5<T_{G1-G5}/L_{G1-G5}<0.64$, where $T_{G1-G5}$ is the sum of the axial thicknesses of the lens elements in the first through fifth group of lens elements, and where $L_{G1-G5}$ is the total axial distance from the first lens surface in the first group of lens elements to the last lens surface in the fifth group of lens elements.

48. The method of claim 47, wherein projecting the pattern through a projection lens system further comprises:
projecting the pattern through a projection lens system that satisfies the condition:

$0.5<T_{G1-G5}/L<0.70$, where $T_{G1-G5}$ is the sum of the axial thicknesses of the lens elements in the first through fifth group of lens elements, and where L is the total axial distance from the reticle to the wafer; and projecting the pattern through an aperture stop disposed between the fourth group of lens elements and the fifth group of lens elements.

49. The method of claim 48, wherein projecting the pattern through the fifth group of lens elements includes projecting the pattern through the fifth group of lens elements wherein a trace of a light ray originating from an axial point on the reticle is furthest from an optical axis of the projection lens system.

50. The method of claim 49, wherein projecting the pattern through a projection lens system includes projecting the pattern through the fifth group of lens elements that satisfy the condition:

$0.21 < h_{asp}/h_{max} \leq 1$, where $h_{max}$ is a maximum distance between the optical axis and the trace of a marginal ray originating on an axial location on the reticle and $h_{asp}$ is a distance from the optical axis at which the trace passes through an aspherical lens surface in the fifth group of lens elements.

51. The method of claim 48, wherein projecting the pattern through a projection lens system includes projecting the pattern through the fifth group of lens elements that satisfy the condition:

$0.21 < h_{asp}/h_{max} \leq 1$, where $h_{max}$ is a maximum distance between the optical axis and the trace of a marginal ray originating on an axial location on the reticle and $h_{asp}$ is a distance from the optical axis at which the trace passes through an aspherical lens surface in the fifth group of lens elements.

52. The method of claim 47, wherein projecting the pattern through the fifth group of lens elements includes:
projecting the pattern through the fifth group of lens elements wherein a trace of a light ray originating from an axial point on the reticle is furthest from an optical axis of the projection lens system; and
projecting the pattern through an aperture stop disposed between the fourth group of lens elements and the fifth group of lens elements.

53. The method of claim 52, wherein projecting the pattern through a projection lens system includes projecting the pattern through the fifth group of lens elements that satisfy the condition:

$0.21 < h_{asp}/h_{max} \leq 1$, where $h_{max}$ is a maximum distance between the optical axis and the trace of a marginal ray originating on an axial location on the reticle and $h_{asp}$ is a distance from the optical axis at which the trace passes through an aspherical lens surface in the fifth group of lens elements.

54. The method of claim 47, wherein illuminating a pattern on a reticle includes illuminating the pattern on a reticle with an excimer laser.

55. A method of transferring a pattern on a reticle onto a wafer, the method comprising:
illuminating a pattern on a reticle;
projecting the pattern through a projection lens system onto a wafer;
wherein projecting the pattern through the projection lens system includes;
projecting the pattern through a first group of lens elements having a positive refractive power;
projecting the pattern through a second group of lens elements having a negative refractive power;
projecting the pattern through a third group of lens elements having a positive refractive power;
projecting the pattern through a fourth group of lens elements having a negative refractive power;
projecting the pattern through a fifth group of lens elements having a positive refractive power and at least one aspherical lens surface; and
wherein the projection lens system satisfies the conditions:

$0.5 < T_{G1-G5}/L < 0.70$ and $0.5 < T_{G1-G5}/L_{G1-G5} < 0.64$, where $T_{G1-G5}$ is the sum of the axial thicknesses of the lens elements in the first through fifth group of lens elements, where L Is the total axial distance from the reticle to the wafer, and where $L_{G1-G5}$ is the total axial distance from the first lens surface in the first group of lens elements to the last lens surface in the fifth group of lens elements.

56. The method of claim 55, wherein illuminating a pattern on a reticle includes illuminating the pattern on a reticle with an excimer laser.

* * * * *